US012615040B2

(12) United States Patent
Govind et al.

(10) Patent No.: US 12,615,040 B2
(45) Date of Patent: Apr. 28, 2026

(54) QUASI TRUE TIME DELAY

(71) Applicant: Cornell University, Ithaca, NY (US)

(72) Inventors: Bala Govind, Ithaca, NY (US);
Thomas Tapen, Ithaca, NY (US);
Alyssa Apsel, Ithaca, NY (US)

(73) Assignee: Cornell University, Ithaca, NY (US)

( * ) Notice: Subject to any disclaimer, the term of this patent is extended or adjusted under 35 U.S.C. 154(b) by 24 days.

(21) Appl. No.: 18/908,585

(22) Filed: Oct. 7, 2024

(65) Prior Publication Data

US 2025/0119130 A1 Apr. 10, 2025

Related U.S. Application Data

(60) Provisional application No. 63/633,380, filed on Apr. 12, 2024, provisional application No. 63/588,555, filed on Oct. 6, 2023.

(51) Int. Cl.
H03K 5/133 (2014.01)
H03K 5/00 (2006.01)

(52) U.S. Cl.
CPC ... H03K 5/133 (2013.01); H03K 2005/00058 (2013.01); H03K 2005/0015 (2013.01)

(58) Field of Classification Search
CPC ......... H03K 5/133; H03K 2005/00058; H03K 2005/0015; H03K 5/135; H03K 5/131;
(Continued)

(56) References Cited

U.S. PATENT DOCUMENTS 5,014,023 A * 5/1991 Mantele ................... H03H 7/20
342/372
5,180,998 A * 1/1993 Willems ................. H03H 11/20
327/237
(Continued)

FOREIGN PATENT DOCUMENTS

JP 4417666 B2 2/2010
KR 102521193 B1 4/2023
(Continued)

OTHER PUBLICATIONS

Tapen et al., "Ultrawideband Frequency Synthesis Using the Compact Tunable Transmission Line (CTTL)," IEEE Transactions on Microwave Theory and Techniques, vol. 70, No. 7, pp. 3374-3384, Jul. 2022.
(Continued)

*Primary Examiner* — John W Poos
(74) *Attorney, Agent, or Firm* — Barnes & Thornburg

(57) ABSTRACT

An integrated circuit includes a programmable reflective load line that includes main delay segments arranged in series between an input of the programmable reflective load line and ground, variable delay modules arranged in parallel between nodes adjoining the main delay segments and ground, and main switches, with each main switch arranged between one of the variable delay modules and one of the nodes adjoining the main delay segments. Each variable delay module includes sub-delay segments arranged in series between the associated main switch and ground. Each variable delay module also includes one or more sub-delay switches, with each sub-delay switch arranged between a node adjoining two of the associated sub-delay segments and ground. The integrated circuit may further include a hybrid coupler arranged with the programmable reflective
(Continued)

load line and another programmable reflective load line as a reflective-type phase-shifter.

20 Claims, 13 Drawing Sheets

(58) Field of Classification Search
CPC ...... H03K 5/1565; H03K 3/0315; H03K 5/14; H03K 3/0322; H03K 5/06; H03K 5/13; H03K 5/26; H03K 2005/00019; H03K 2005/00208; H03K 2005/00026; H03K 19/17744; H03K 2005/00156; H03K 3/356; H03K 2005/00032; H03K 5/00; H03K 5/00006; H03K 5/15; H03K 19/017581; H03K 19/21; H03K 2005/00045; H03K 2005/00052; H03K 5/01; H03K 7/08; H03K 2005/00071; H03K 2005/00097; H03K 2005/00104; H03K 5/15013; H03K 5/1504; H03K 3/017; H03K 3/354; H03K 5/1506; H03K 5/1508; H03K 5/151; H03K 17/6874; H03K 19/1776; H03K 2005/00078; H03K 2005/0013; H03K 23/542; H03K 23/66; H03K 5/15066; H03K 17/164; H03K 19/0175; H03K 19/173; H03K 2005/00195; H03K 2005/00286; H03K 3/84; H03K 5/1252; H03K 5/134; H03K 5/1515; H03K 5/1534; H03K 7/06; H03K 19/00323; H03K 19/177; H03K 19/17704; H03K 19/17712; H03K 19/17716; H03K 19/1774; H03K 2005/00039; H03K 2005/00065; H03K 2005/00143; H03K 2005/00176; H03K 2005/00228; H03K 21/02; H03K 23/667; H03K 3/013; H03K 3/45; H03K 3/55; H03K 5/145; H03H 11/20; H03H 11/265; H03H 17/0009; H03H 17/0054; H03H 17/08; H03H 7/33; H03H 7/325; H03H 11/26; H03H 11/126; H03H 11/1291; H03H 11/12; H03H 21/0012; H03H 21/0043; H03H 7/18; H03H 7/38; H03H 11/1252; H03H 11/16; H03H 11/32; H03H 11/34; H03H 15/00; H03H 17/0275; H03H 19/004; H03H 2017/0247; H03H 2210/015; H03H 2210/021; H03H 2210/025; H03H 2210/04; H03H 2240/00; H03H 7/0115; H03H 7/0161; H03H 7/175; H03H 7/1775; H03H 17/0018; H03H 17/0027; H03H 17/0248; H03H 17/0294; H03H 17/06; H03H 17/0628; H03H 7/20; H03H 7/345; H01Q 3/2682; H01Q 3/30; H01Q 3/36; H01Q 1/246; H01Q 3/26; H01Q 3/267; H01Q 1/38; H01Q 21/0006; H01Q 21/065; H01Q 3/2694; H01Q 3/40; H01Q 3/44; H01Q 1/48; H01Q 1/525; H01Q 21/0087; H01Q 21/24; H01Q 1/50; H01Q 1/521; H01Q 21/22; H01Q 21/06; H01Q 3/24; H01Q 21/08; H01Q 21/245; H01Q 25/008; H01Q 3/2676; H01Q 3/28; H01Q 3/38; H01Q 3/42; H01Q 3/46; H01Q 7/00; H01Q 9/0442; H01Q 9/0457; H01Q 1/46; H01Q 15/14; H01Q 15/18; H01Q 15/246; H01Q 19/10; H01Q 19/18; H01Q 21/26; H01Q 21/28; H01Q 9/0414; H01Q 9/0435; H01Q 9/145; H01Q 21/061; H01Q 21/062; H01Q 3/2605; H01Q 3/32; H01Q 1/243; H01Q 1/28; H01Q 15/24; H01Q 21/00; H01Q 21/0025; H01Q 21/0081; H01Q 25/002; H01Q 3/01; H01Q 3/34; H01Q 1/24; H01Q 1/364; H01Q 1/405; H01Q 15/0053; H01Q 15/08; H01Q 19/027; H01Q 19/06; H01Q 21/0031; H01Q 21/0037; H01Q 23/00; H01Q 25/00; H01Q 25/001; H01Q 25/005; H01Q 25/007; H01Q 3/14; H01Q 3/22; H01Q 3/2617; H01Q 3/2658; H01Q 9/26; H03L 7/0816; H03L 7/0814; H03L 7/087; H03L 7/0995; H03L 7/0805; H03L 7/0818; H03L 7/07; H03L 7/0812; H03L 7/0998; H03L 7/0891; H03L 7/081; H03L 7/089; H03L 7/0807; H03L 7/085; H03L 7/00; H03L 7/0996; H03L 7/091; H03L 7/16; H03L 2207/06; H03L 7/093; H03L 7/095; H03L 7/08; H03L 7/0896; H03L 7/104; H03L 7/10; H03L 7/18; H03L 7/23; H03L 7/083; H03L 2207/14; H03L 7/0802; H03L 7/0997; H03L 7/1976; H03L 2207/50; H03L 7/183; H03L 2207/18; H03L 7/06; H03L 7/0895; H03L 7/097; H03L 7/099; H03L 7/185; H03L 7/24; H03L 1/00; H03L 1/02; H03L 7/0992; H03L 7/0993; H03L 7/113; H03L 7/191; H03L 7/197; H03L 7/1974; H03L 7/199; H04L 1/0002; H04L 1/0025; H04L 1/0026; H04L 1/0018; H04L 1/001; H04L 7/0337; H04L 7/0075; H04L 7/0037; H04L 7/0331; H04L 7/033; H04L 7/042; H04L 7/10; H04L 25/03019; H04L 25/14; H04L 5/14; H04L 7/0008; H04L 7/0025; H04B 10/505; H04B 10/508; H04B 1/04; H04B 3/23; H04B 10/548; H04B 17/21; H04B 1/525; H04B 17/11; H04B 17/14; H04B 1/0014; H04B 1/0021; H04B 1/40; H04B 10/5051; H04B 10/60; H04B 7/0408; H04B 1/71635; H04B 10/2543; H04B 10/2563; H04B 10/2569; H04B 10/5053; H04B 15/06; H04B 17/0082; H04B 2215/067; H04B 7/0491; H04B 7/0617; H04B 7/0667; H04B 7/084; H04B 7/086; H04B 7/0894; H04B 7/18504; H04B 7/18513; H04B 10/5055; H04B 10/5162; H04B 10/5561; H04B 10/66; H04B 17/0085; H04B 17/102; H04B 17/12; H04B 17/18; H04B 17/202; H04B 17/382; H04B 7/022; H04B 7/0404; H04B 7/0671; H04B 7/0837; H04W 84/12; H04W 24/10; H04W 72/0446; H04W 24/00; H04W 48/16; H04W 52/0206; H04W 52/0229; H04W 8/005; H04W 24/02; H04W 68/005; H04W 72/23; H04W 12/041; H04W 24/08; H04W 28/04; H04W 28/06; H04W 28/16; H04W 28/18; H04W 4/02; H04W 4/025; H04W 4/027; H04W 4/029; H04W 4/06; H04W 4/35; H04W 4/70; H04W 4/90; H04W 48/10; H04W 48/12; H04W 52/146; H04W 52/247; H04W 52/383; H04W 56/00; H04W 56/001; H04W 72/04; H04W 72/0453; H04W 72/20;

H04W 72/51; H04W 72/54; H04W 74/0833; H04W 74/0838; H04W 76/14; H04W 76/15; H04W 76/27; H04W 76/28; H04W 80/02; H04W 84/042; H04W 88/02; H04W 88/08; H04W 92/18

See application file for complete search history.

(56) References Cited

U.S. PATENT DOCUMENTS

| | | | | |
|---|---|---|---|---|
| 5,920,230 | A * | 7/1999 | Beall | H03F 1/223 |
| | | | | 330/277 |
| 7,969,359 | B2 | 6/2011 | Krishnaswamy et al. | |
| 8,208,885 | B1 | 6/2012 | Lam | |
| 8,514,034 | B2 | 8/2013 | Kang | |
| 8,923,379 | B2 | 12/2014 | Matsudaira et al. | |
| 9,059,679 | B2 | 6/2015 | Edelstein et al. | |
| 9,287,846 | B2 * | 3/2016 | Lindenmeier | H01P 1/184 |
| 9,559,663 | B2 | 1/2017 | Knierim | |
| 9,577,600 | B2 | 2/2017 | Natarajan et al. | |
| 9,660,605 | B2 | 5/2017 | Tinsley et al. | |
| 9,819,325 | B2 | 11/2017 | Hahn et al. | |
| 10,050,604 | B2 | 8/2018 | Nielsen et al. | |
| 10,062,946 | B2 | 8/2018 | Sharma et al. | |
| 10,594,289 | B2 | 3/2020 | Vilenskiy et al. | |
| 11,264,976 | B2 | 3/2022 | Hamdan et al. | |
| 11,381,230 | B2 | 7/2022 | Yu et al. | |
| 11,444,605 | B2 | 9/2022 | Yajima | |
| 11,658,647 | B2 | 5/2023 | Krishnamurthi et al. | |
| 11,711,068 | B2 * | 7/2023 | Birkbeck | H03H 17/08 |
| | | | | 327/250 |
| 2002/0008583 | A1 * | 1/2002 | Shigematsu | H03F 3/607 |
| | | | | 330/286 |
| 2018/0131102 | A1 * | 5/2018 | Wang | H01Q 3/38 |
| 2022/0181762 | A1 | 6/2022 | Lourenco et al. | |
| 2023/0261628 | A1 | 8/2023 | Tapen et al. | |

FOREIGN PATENT DOCUMENTS

| | | |
|---|---|---|
| WO | 2012155284 A1 | 11/2012 |
| WO | 2022015758 A1 | 1/2022 |
| WO | 2023240330 A1 | 12/2023 |

OTHER PUBLICATIONS

Psychogiou et al., "W-band Tunable Reflective Type Phase Shifter Based on Waveguide-Mounted RF MEMS," 2011 IEEE MTT-S International Microwave Workshop Series on Millimeter Wave Integration Technologies, 4 pages.

Tokgoz, "Broadband Phase Shifter Realization With Surface Micromachined Lumped Components," Thesis, 312 pages, Sep. 2012.

Tsai et al., "A 27-42-GHz Low Phase Error 5-Bit Passive Phase Shifter in 65-nm CMOS Technology," IEEE Microwave and Wireless Components Letters, vol. 30, No. 9, pp. 900-903, Sep. 2020.

Wang et al., "Subwavelength Grating Enabled On-Chip Ultra-Compact Optical True Time Delay Line," Nature: Scientific Reports, 10 pages, Jul. 26, 2016.

Wang et al., "Continuously Tunable Ultra-Thin Silicon Waveguide Optical Delay Line," Optica, vol. 4, No. 5, pp. 507-515, May 2017.

Woods et al., "CMOS millimeter wave phase shifter based on tunable transmission lines," Proceedings of the IEEE 2013 Custom Integrated Circuits Conference, San Jose, CA, USA, 4 pages, 2013.

Paul et al., "Photonic Beamforming for 5G and Beyond: A Review of True Time Delay Devices Enabling Ultra-Wideband Beamforming for mmWave Communications," IEEE Access, vol. 10, pp. 75513-75526, Jul. 22, 2022.

Li et al., "A 32-40 GHz 7-bit CMOS Phase Shifter with 0.38dB/1.6° RMS Magnitude/Phase Errors for Phased Array Systems," 2020 IEEE Radio Frequency Integrated Circuits Symposium (RFIC), Los Angeles, CA, USA, pp. 319-322, 2020.

Hu et al., "A 1-21 GHZ, 3-bit CMOS True Time Delay Chain with 274 ps Delay for Ultra-broadband Phased Array Antennas," Proceedings of the 45th European Microwave Conference, pp. 1347-1350, Sep. 2015.

Anjos et al., "A 24-30 GHz Ultra-Compact Phase Shifter Using All-Pass Networks for 5G User Equipment," 2020 IEEE/MTT-S International Microwave Symposium (IMS), Los Angeles, CA, USA, pp. 217-220, 2020.

Govind et al., "Ultra-Compact Quasi-True Time Delay for Boosting Wireless Channel Capacity," Nature, vol. 627, pp. 88-94, Mar. 2024.

Yang et al., "A Compact E-Mode GaAs pHEMT Phase Shifter MMIC for 5G Phased-Array Systems," 2019 IEEE Asia-Pacific Microwave Conference (APMC), Singapore, pp. 488-490, 2019.

* cited by examiner

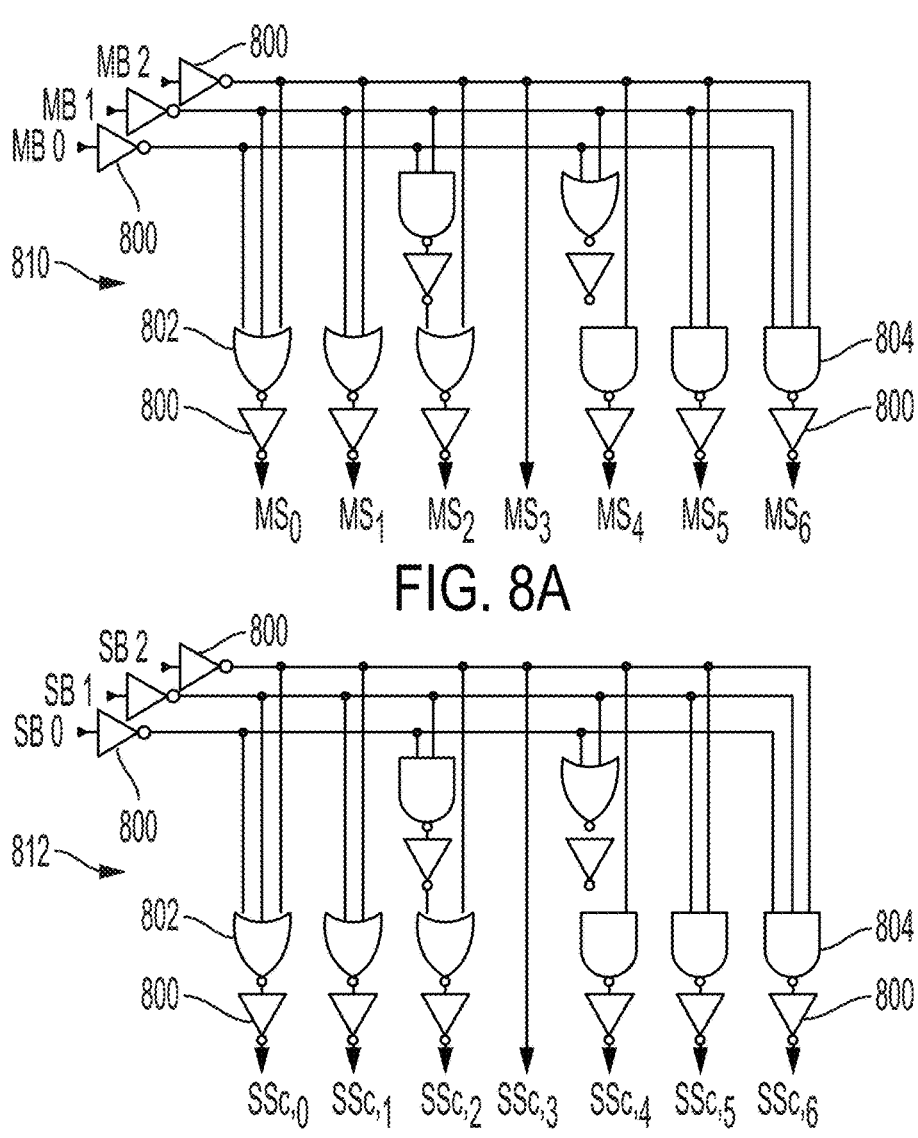
FIG. 8A
FIG. 8B
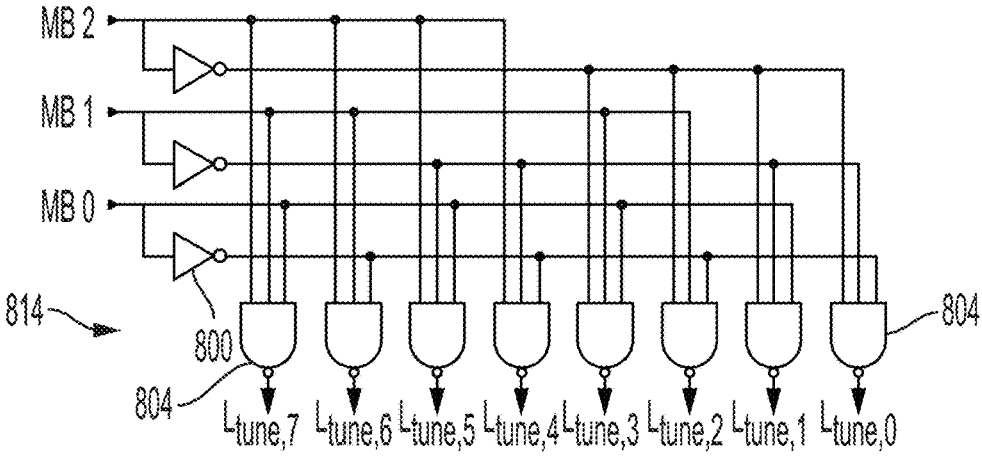
FIG. 8C

QUASI TRUE TIME DELAY

CROSS-REFERENCE TO RELATED APPLICATIONS

This application claims the benefit of U.S. Provisional Patent Application No. 63/588,555, filed Oct. 6, 2023, and of U.S. Provisional Patent Application No. 63/633,380, filed Apr. 12, 2024. Each of the foregoing applications is incorporated herein by reference in its entirety.

TECHNICAL FIELD

The present disclosure relates to quasi true time delay, including reflective-type phase-shifters with three-dimensional, variable reflectors within a sub-wavelength footprint.

BACKGROUND

Beamforming has arisen as a critical tool to boost network capacity in communications hardware. Mobile devices, driving the expansion of ubiquitous communication, require compact, integrated beamformers. In any microwave, acoustic, or optical beam-steering system, there is a fundamental choice in architecture between using phased arrays and timed arrays. An array of typical phase shifters occupies a small footprint and can theoretically have continuous phase tuning; however, it introduces frequency dependence to the spatial delay, limiting the desired beam pattern to a narrow bandwidth. Beyond this bandwidth, the radiation pattern is smeared out. As such, the phased array imparts a "squint" to the beam, and the extra bandwidth cannot be directed to a target. In other words, typical phase shifters severely limit maximum data (in Gbps) transmitted or received through the wireless channel.

On the other hand, true time delay (TTD) elements prevent beam squint and boost channel capacity but are prohibitively expensive in terms of chip area. This is because they use the most straightforward method of extending or shortening the path of the signal, a physically long-wavelength-scale cascade of transmission lines to implement time delay. Tuning of time delay is achieved using a series of transistor switches that direct the microwave signal through different lengths of waveguides in the path of the signal. This cascade of switches adds insertion loss, noise and nonlinearity in exchange for tuning, trading off resolution for function unless exotic phase-change materials or microelectromechanical switches that cannot be easily integrated within a commercial semiconductor process are used.

Integrating beam-steering technology into mobile applications requires inexpensive chip-scale delay elements that: (1) produce a relatively constant time delay over a large bandwidth; (2) achieve precise phase resolution; and (3) occupy a small area in a standard CMOS technology. In addition to these expectations, it should also achieve good impedance matching, low insertion loss across the frequency range, and should preferably give 180° of projected phase-tuning range to cover a wide azimuth and elevation-beam-angle range. Finally, the component should be of a passive variety that consumes no DC power (opposite to active vector-modulated phase shifters) to minimize power in short-range, ultra-high-data-rate links and wide-swath radar imaging.

SUMMARY

According to one aspect, an integrated circuit may comprise a first programmable reflective load line. The first programmable reflective load line may comprise a first plurality of main delay segments arranged in series between a first input and ground, a first plurality of variable delay modules arranged in parallel between (i) nodes adjoining the main delay segments of the first plurality of main delay segments and (ii) ground, and a first plurality of main switches, wherein each main switch of the first plurality of main switches is arranged between (i) one of the first plurality of variable delay modules and (ii) one of the nodes adjoining the main delay segments of the first plurality of main delay segments. Each variable delay module of the first plurality of variable delay modules may comprise a plurality of sub-delay segments arranged in series between the associated main switch and ground, and one or more sub-delay switches, wherein each sub-delay switch of the one or more sub-delay switches is arranged between (i) a node adjoining two of the associated plurality of sub-delay segments and (ii) ground.

In some embodiments, the integrated circuit may be implemented in a semiconductor process stack such that the first programmable reflective load line has a sub-wavelength footprint.

In some embodiments, the plurality of sub-delay segments of each variable delay module of the first plurality of variable delay modules may comprise vertically stacked coils formed in multiple metal layers of the semiconductor process stack.

In some embodiments, the main switches of the first plurality of main switches may increase in size with increasing distance from the first input along the first plurality of main delay segments.

In some embodiments, the first plurality of main delay segments may comprise eight main delay segments, the first plurality of main switches may comprise seven main switches, the first plurality of variable delay modules may comprise seven variable delay modules, the plurality of sub-delay segments may comprise eight sub-delay segments, the one or more sub-delay switches may comprise seven sub-delay switches, and the first programmable reflective load line may occupy an area of less than 0.1 mm² of the integrated circuit.

In some embodiments, the integrated circuit may further comprise control circuitry configured to supply control signals to the first plurality of main switches and to the one or more sub-delay switches of each variable delay module of the first plurality of variable delay modules to program a first signal path through the first programmable reflective load line, the first signal path including at least one of the first plurality of main delay segments and at least one of the plurality of sub-delay segments of one of the first plurality of variable delay modules.

In some embodiments, the integrated circuit may further comprise a second programmable reflective load line. The second programmable reflective load line may comprise a second plurality of main delay segments arranged in series between a second input and ground, a second plurality of variable delay modules arranged in parallel between (i) nodes adjoining the main delay segments of the second plurality of main delay segments and (ii) ground, and a second plurality of main switches, wherein each main switch of the second plurality of main switches is arranged between (i) one of the second plurality of variable delay modules and (ii) one of the nodes adjoining the main delay segments of the second plurality of main delay segments. Each variable delay module of the second plurality of variable delay modules may comprise a plurality of sub-delay segments arranged in series between the associated main switch and ground, and one or more sub-delay switches, wherein each sub-delay switch of the one or more sub-delay switches is arranged between (i) a node adjoining two of the associated plurality of sub-delay segments and (ii) ground.

In some embodiments, the control circuitry may be further configured to supply control signals to the second plurality of main switches and to the one or more sub-delay switches of each variable delay module of the second plurality of variable delay modules to program a second signal path through the second programmable reflective load line, the second signal path including at least one of the second plurality of main delay segments and at least one of the plurality of sub-delay segments of one of the second plurality of variable delay modules.

In some embodiments, the integrated circuit may further comprise a hybrid coupler having (i) an input port, (ii) an output port, (iii) a coupled port electrically connected to the first input of the first programmable reflective load line, and (iv) a through port electrically connected to the second input of the second programmable reflective load line.

In some embodiments, the control circuitry may be configured to program the first signal path through the first programmable reflective load line and the second signal path through the second programmable reflective load line such that the first and second signal paths provide a selected time delay for a signal received at the input port of the hybrid coupler and provided at the output port of the hybrid coupler.

In some embodiments, the first programmable reflective load line further comprises a first tunable capacitance arranged between (i) a node adjoining the first input and the first plurality of main delay segments and (ii) ground; the second programmable reflective load line further comprises a second tunable capacitance arranged between (i) a node adjoining the second input and the second plurality of main delay segments and (ii) ground; and the control circuitry may be further configured to control the first and second tunable capacitances to fine tune the time delay applied to the signal received at the input port of the hybrid coupler.

In some embodiments, the hybrid coupler, the first programmable reflective load line, and the second programmable reflective load line may together occupy an area of less than 0.15 mm$^2$ of the integrated circuit and provide phase resolution of under 1 degree.

In some embodiments, the integrated circuit may be implemented in a semiconductor process stack such that the hybrid coupler, the first programmable reflective load line, and the second programmable reflective load line each have a sub-wavelength footprint.

In some embodiments, the plurality of sub-delay segments of each variable delay module of the first plurality of variable delay modules, the plurality of sub-delay segments of each variable delay module of the second plurality of variable delay modules, and the hybrid coupler may each comprise vertically stacked coils formed in multiple metal layers of the semiconductor process stack.

In some embodiments, the hybrid coupler, the first programmable reflective load line, the second programmable reflective load line, and the control circuitry may form part of a transmitter module of the integrated circuit, and the integrated circuit may comprise an array of such transmitter modules.

In some embodiments, each antenna of an array of antennas may be electrically connected to one of the transmitter modules of the array of transmitter modules, and the integrated circuit may be configured to introduce varying amounts of time delay to copies of a radio signal using the array of transmitter modules such that the time-delayed copies of the radio signal transmitted from the array of antennas form a beam.

In some embodiments, the array of transmitter modules may occupy an area of no more than 2.1 mm$^2$ of the integrated circuit and provide a normalized array factor of greater than 0.8 across at least 8 GHz of bandwidth.

According to another aspect, a method may comprise providing control signals to a first plurality of main switches arranged along a first programmable reflective load line of an integrated circuit to (i) open any main switch of the first plurality of main switches that is nearer to a first input of the first programmable reflective load line than a selected main switch of the first plurality of main switches and (ii) close the selected main switch and any main switch of the first plurality of main switches that is further from the first input than the selected main switch, providing control signals to a first plurality of sub-delay switches of the first programmable reflective load line of the integrated circuit to (i) open any sub-delay switch of the first plurality of sub-delay switches that is nearer to the selected main switch of the first programmable reflective load line than a selected sub-delay switch of the first plurality of sub-delay switches and (ii) close the selected sub-delay switch and any sub-delay switch of the first plurality of sub-delay switches that is further from the selected main switch than the selected sub-delay switch, and transmitting a signal along the first programmable reflective load line, wherein the signal travels from the first input, through a number of main delay segments of the first programmable reflective load line arranged between the first input and the selected main switch, through the selected main switch, through a number of sub-delay segments of the first programmable reflective load line arranged between the selected main switch and the selected sub-delay switch, through the selected sub-delay switch, to ground, and then returns along the reverse path.

In some embodiments, the method may further comprise providing control signals to a second plurality of main switches arranged along a second programmable reflective load line of the integrated circuit to (i) open any main switch of the second plurality of main switches that is nearer to a second input of the second programmable reflective load line than a selected main switch of the second plurality of main switches and (ii) close the selected main switch and any main switch of the second plurality of main switches that is further from the second input than the selected main switch, providing control signals to a second plurality of sub-delay switches of the second programmable reflective load line of the integrated circuit to (i) open any sub-delay switch of the second plurality of sub-delay switches that is nearer to the selected main switch of the second programmable reflective load line than a selected sub-delay switch of the second plurality of sub-delay switches and (ii) close the selected sub-delay switch and any sub-delay switch of the second plurality of sub-delay switches that is further from the selected main switch than the selected sub-delay switch, and transmitting the signal along the second programmable reflective load line, wherein the signal travels from the second input, through a number of main delay segments of the second programmable reflective load line arranged between the second input and the selected main switch, through the selected main switch, through a number of sub-delay segments of the second programmable reflective load line arranged between the selected main switch and the selected sub-delay switch, through the selected sub-delay switch, to ground, and then returns along the reverse path.

In some embodiments, the number of main delay segments of the first programmable reflective load line arranged between the first input and the selected main switch of the first programmable reflective load line is equal to the number of main delay segments of the second programmable reflective load line arranged between the second input and the selected main switch of the second programmable reflective load line, and the number of sub-delay segments of the first programmable reflective load line arranged between the selected main switch and the selected sub-delay switch of the first programmable reflective load line is equal to the number of sub-delay segments of the second programmable reflective load line arranged between the selected main switch and the selected sub-delay switch of the second programmable reflective load line.

In some embodiments, the method may further comprise receiving the signal at an input port of a hybrid coupler of the integrated circuit, wherein a coupled port of the hybrid coupler is electrically connected to the first input to transmit the signal along the first programmable reflective load line, and wherein a through port of the hybrid coupler is electrically connected to the second input to transmit the signal along the second programmable reflective load line.

In some embodiments, the method may further comprise providing control signals to a first tunable capacitance arranged between (i) a node adjoining the first input and the main delay segments of the first programmable reflective load line and (ii) ground, and to a second tunable capacitance arranged between (i) a node adjoining the second input and the main delay segments of the second programmable reflective load line and (ii) ground, to fine tune a time delay applied to the signal received at the input port of the hybrid coupler.

In some embodiments, the integrated circuit may be implemented in a semiconductor process stack, and the sub-delay segments of the first programmable reflective load line, the sub-delay segments of the second programmable reflective load line, and the hybrid coupler may each comprise vertically stacked coils formed in multiple metal layers of the semiconductor process stack.

BRIEF DESCRIPTION OF THE DRAWINGS

The detailed description particularly refers to the following figures, in which:

FIG. 8A is a simplified block diagram of a portion of control circuitry of the integrated circuit of FIG. 4 that provides control signals to main switches of the two programmable reflective load lines;

FIG. 8B is a simplified block diagram of another portion of the control circuitry of the integrated circuit of FIG. 4 that provides control signals to sub-delay switches of the two programmable reflective load lines;

FIG. 8C is a simplified block diagram of another portion of the control circuitry of the integrated circuit of FIG. 4 that also provides control signals to the sub-delay switches of the two programmable reflective load lines;

FIG. 12A-1 is an enlarged detail of a portion of the graph of FIG. 12A;

DETAILED DESCRIPTION

Figure 1:
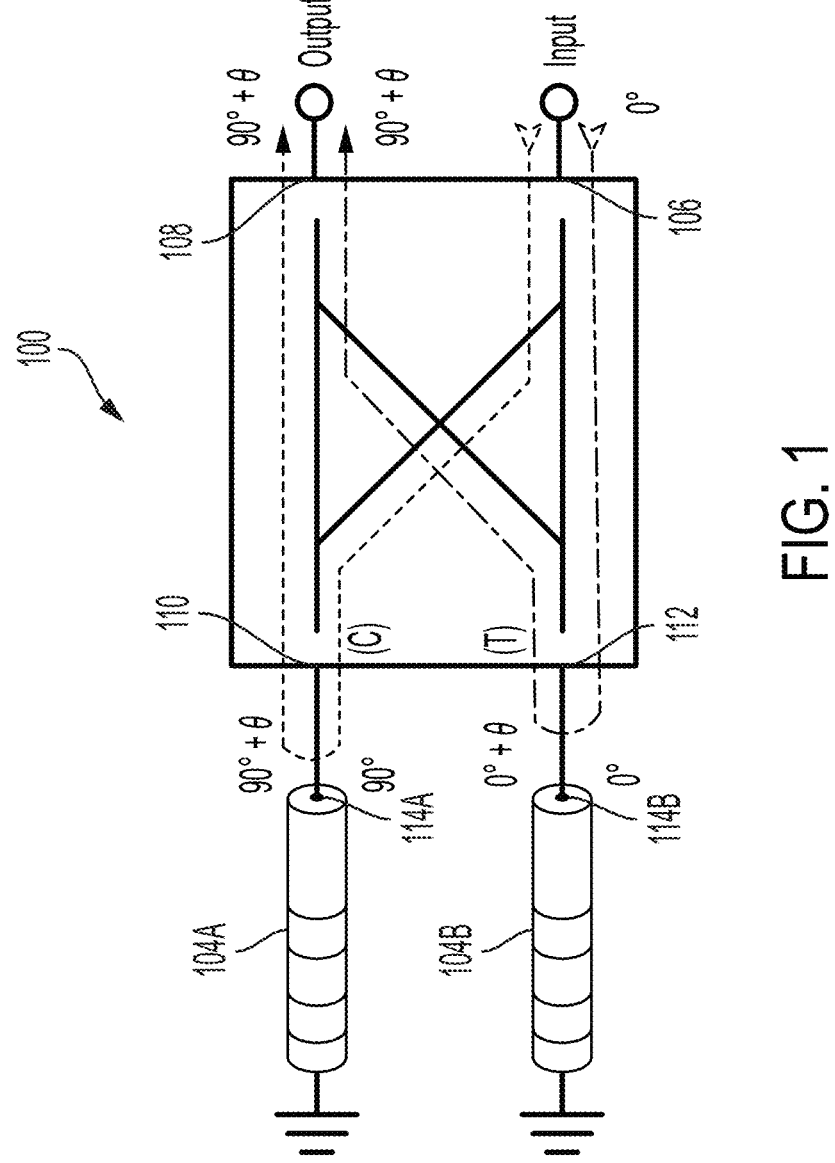
FIG. 1 is a simplified block diagram illustrating signal flow within a reflective-type phase-shifter (RTPS) including a hybrid coupler and two programmable reflective load lines according to the present disclosure.

While the concepts of the present disclosure are susceptible to various modifications and alternative forms, specific illustrative embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The present disclosure introduces a quasi-true time delay (Q-TTD) component that miniaturizes TTD elements and breaks fundamental channel-capacity limits of prior art technologies. While the illustrative embodiments of the microwave devices described herein are implemented in a complementary metal-oxide-semiconductor (CMOS) technology, it is contemplated that alternative embodiments may be implemented in other semiconductor technologies, such as Gallium Nitride, Gallium Arsenide, Indium Phosphide, and Bipolar CMOS (BiCMOS), by way of example. Apparatus and methods according to the present disclosure utilize reflective-type phase-shifters (RTPS) with three-dimensional (3D) variable TTD reflectors within a sub-wavelength footprint. These apparatus and methods achieve ultra-broadband phase tuning by using the reflectors to vary the length of the waveguide's path to ground and produce delay-to-area ratios that yield a substantially higher on-chip channel capacity compared with existing technologies. The presently disclosed Q-TTD component, when integrated in arrays, enables high-resolution imaging and low-squint beamforming for wideband communication, on-chip radar, and other applications.

Referring now to FIG. 1, a reflective-type phase-shifter (RTPS) 100 according to the present disclosure includes a hybrid coupler 102 and two programmable reflective load lines 104A, 104B. In the illustrative embodiment, the hybrid coupler 102 is a 90° hybrid coupler having an input port 106, an output port 108, a coupled port 110, and a through port 112. As described further below, the hybrid coupler 102 comprises two inductors that overlap to establish magnetic coupling, as well as coupling capacitors that establish electric coupling between the input port 102 and the coupled port 110 and between the through port 112 and the output port 108. An input 114A of the programmable reflective load line 104A is electrically connected to the coupled port 110 of the hybrid coupler 102, while an input 114B of the programmable reflective load line 104B is electrically connected to the through port 112 of the hybrid coupler 102. As suggested by the dashed lines in FIG. 1, the hybrid coupler 102 splits a signal received at the input port 106 into two parts, provides one part of the signal to the coupled port 110, and provides the other part of the signal to the through port 112. These partial signals each travel through and reflect back from one of the programmable reflective load lines 104A, 104B, imparting a time delay. The phase response of the hybrid coupler 102 is such that the two reflected signals cancel at the input port 106 and add in phase at the output port 108. As described further below, the desired time delay between the signal received at the input port 106 of the hybrid coupler 102 and that provided at the output port 108 of the hybrid coupler 102 is achieved using control circuitry that programs a specific signal path through each of the programmable reflective load lines 104A, 104B.

Figure 2:
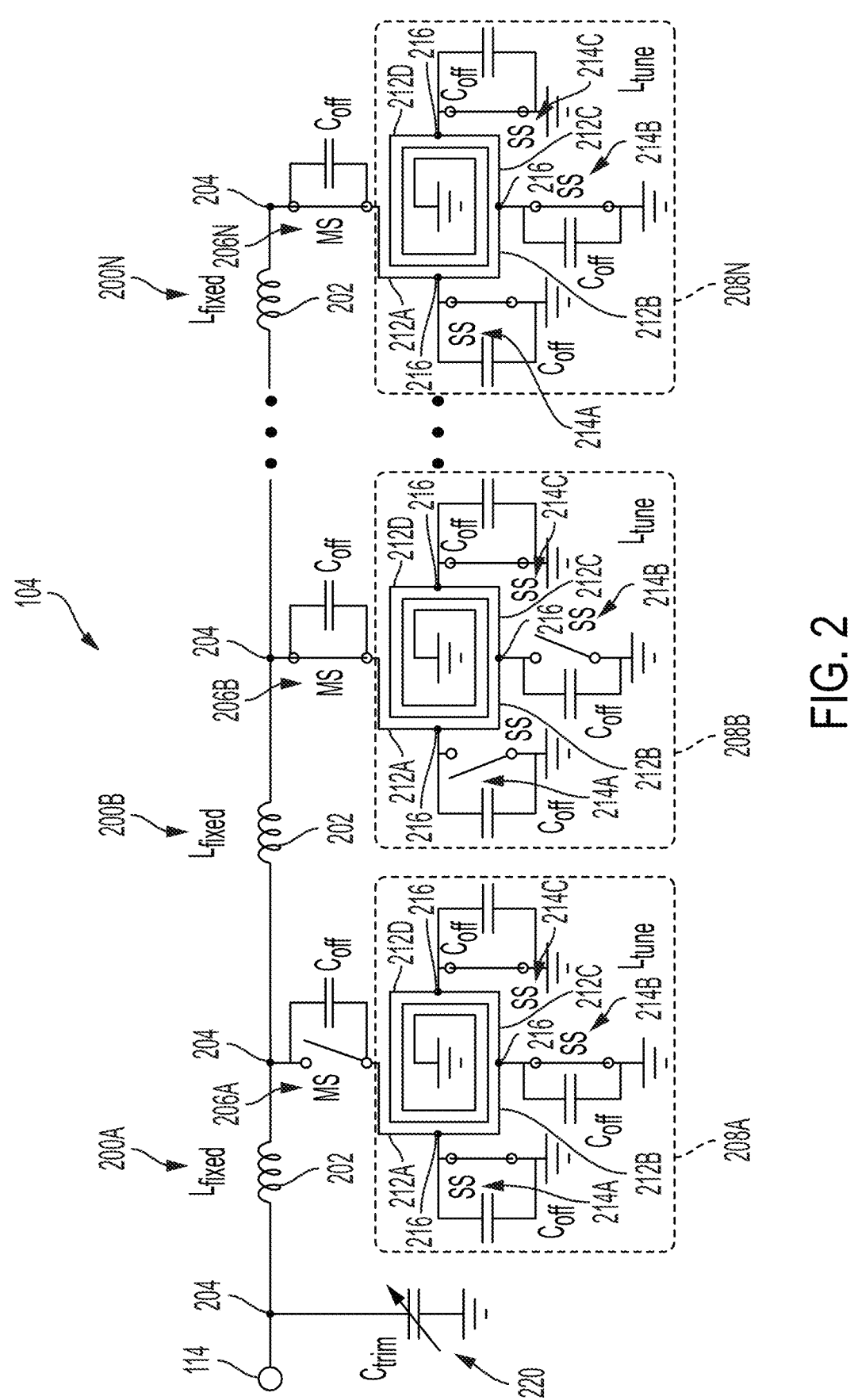
FIG. 2 is a simplified circuit diagram of each of the programmable reflective load lines of FIG. 1.

FIG. 2 presents a simplified circuit diagram of each of the programmable reflective load lines 104A, 104B. In the illustrative embodiment, the programmable reflective load lines 104A, 104B have the same structure and, thus, when provided with the same set of control signals, produce the same time delay in a signal received at the input port 114. Each programmable reflective load line 104 includes a plurality of main delay segments 200 arranged in series between the input 114 and ground. While FIG. 2 illustratively shows three main delay segments 200A, 200B, 200N, it is contemplated that any number of main delay segments 200 may be used in different embodiments. Each main delay segment 200 includes a fixed inductance ($L_{fixed}$) 202 between two nodes 204 that adjoin the main delay segments 200. Each programmable reflective load line 104 also includes a plurality of variable delay modules 208, which are arranged in parallel between the nodes 204 and ground. While FIG. 2 illustratively shows three variable delay modules 208A, 208B, 208N, it is contemplated that any number of variable delay modules 208 may be used in different embodiments. The variable delay modules 208 provide tunable inductances ($L_{tune}$), as further described below.

Each programmable reflective load line 104 further includes a plurality of main switches (MS) 206. While FIG. 2 illustratively shows three main switches 206A, 206B, 206N, it is contemplated that any number of main switches 206 may be used in different embodiments. Each main switch 206 is arranged between one of the nodes 204 and one of the variable delay modules 208. For instance, as shown in FIG. 2, one side of main switch 206A is electrically connected to the node 204 between main delay segment 200A and 200B, while the other side of main switch 206A is electrically connected to variably delay module 208A. When in a closed state, each main switch 206 couples its associated node 204 to its associated variable delay module 208. In an open state, however, each main switch 206 provides a capacitance ($C_{off}$), which form the distributed capacitance of an artificial transmission line. In a CMOS process, sharp resonances may be produced if the $C_{off}$ value of the main switches is too large. While a large switch provides a low on-resistance ($R_{on}$), the corresponding $C_{off}$ can cause sharp narrowband resonance and give an abrupt phase change and discontinuity in insertion loss. To minimize these issues, in some embodiments, the main switches 206 may increase in size with increasing distance from the input 114 along the plurality of main delay segments 200, which prevents abrupt changes in impedance ($\sqrt{L/C}$) between adjacent subsections of the programmable reflective load line 104.

As shown in the simplified circuit diagram of FIG. 2, each variable delay module 208 comprises an inductive coil 212 coupled between the corresponding main switch 206 and ground. Each variable delay module 208 also comprises a plurality of sub-delay switches (SS) 214 that are electrically connected to the inductive coil 212 at various nodes 216 along its length. The nodes 216 where the sub-delay switches 214 electrically connect to the inductive coil 212 effectively divide the inductive coil 212 into a plurality of sub-delay segments 212A, 212B, 212C, 212D arranged in series between the associated main switch 206 and ground. While FIG. 2 illustratively shows each variable delay module 208 including four sub-delay segments 212A, 212B, 212C, 212D and three sub-delay switches 214A, 214B, 214C, it is contemplated that any number of sub-delay segments 212 and sub-delay switches 214 may be used in different embodiments. Each sub-delay switch 214 is arranged between one the nodes 216 and ground. As such, when in a closed state, each sub-delay switch 214 couples its associated node 216 to ground. In an open state, however, each sub-delay switch 214 provides a capacitance ($C_{off}$).

Each programmable reflective load line 104 also includes a tunable capacitance ($C_{trim}$) 220 arranged between the node 204 adjoining the input 114 and the main delay segments 200 (specifically, the first main delay segment 200A) and ground. In some embodiments, the tunable capacitance 220 may be provided by a varactor. This tunable capacitance 220 may be adjusted to fine tune the delay time provided by each programmable reflective load line 104.

The operation of the programmable reflective load lines 104 is described below with reference to FIG. 3A, in which associated control circuity has programmed a signal path 300 through the programmable reflective load line 104, and with reference to FIG. 3B, in which the associated control circuity has programmed a different signal path 302 through the programmable reflective load line 104. The signal path 302 is longer than the signal path 300. Thus, a signal traveling along the signal path 302 is provided more time delay that a signal traveling along the signal path 300. It will be appreciated from the drawings and the description below that the signal paths 300, 302 are only two exemplary signal paths of the many possible signal paths through the programmable reflective load lines 104 (generally, the number of possible signal paths will be at least as large as the product of the number of main switches 206 multiplied by the number of sub-delay switches 214). It will also be appreciated that a signal traveling along the signal path 300, the signal path 302, or any of the other possible signal paths will reflect once it reaches ground and then follow the reverse path back to the input 114 of the programmable reflective load line 104.

Figure 3A:
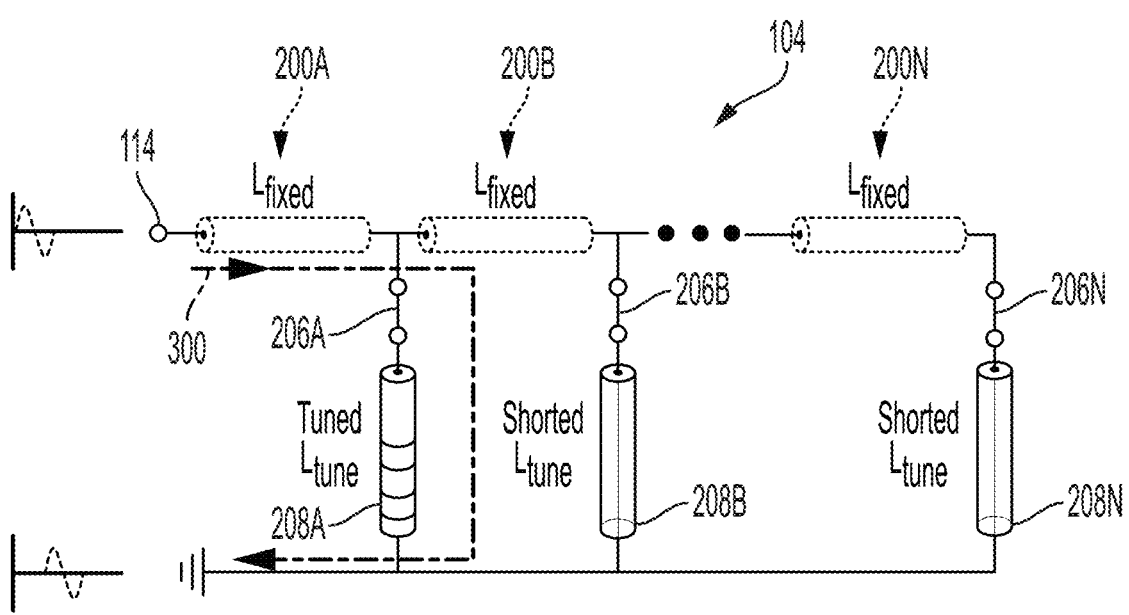
FIG. 3A is a simplified block diagram illustrating one shorter signal path through one of the programmable reflective load lines of FIG. 1.

As one example, to program the signal path 300 through the programmable reflective load line 104, the associated control circuitry supplies control signals to each of the main switches 206 of the programmable reflective load line 104 (illustratively shown as main switches 206A, 206B, 206N in FIG. 3A). In this example, the main switch 206A is the selected main switch through which the signal path 300 will pass. In the illustrative embodiment, the control circuitry sends appropriate control signals to the selected main switch (here, main switch 206A) and to any other main switch(es) that is/are further away from the input 114 (here, main switches 206B, 206N) to cause each of those main switches to close (or remain closed). As a result, each of main switches 206A, 206B, 206N is closed in this example. Additionally, in the illustrative embodiment, the control circuitry sends appropriate control signals to any main switch(es) that is/are nearer to the input 114 than the selected main switch to cause each of those main switches to open (or remain open). In this particular example, there are no such switches.

Furthermore, the control circuitry configures the sub-delay switches 214 in similar manner to the main switches 206. Specifically, the control circuitry provides control signals to at least the sub-delay switches 214 of the variable delay module 208 that is directly connected to the selected main switch (in this example, variable delay module 208A directly connected to main switch 206A). Although not shown in FIG. 3A, one of the sub-delay switches 214 of the variable delay module 208A is chosen as the selected sub-delay switch 214 through which the signal path 300 will pass. In the illustrative embodiment, the control circuitry sends appropriate control signals to the selected sub-delay switch 214 and to any other sub-delay switch(es) 214 that is/are further away from the selected main switch 206A to cause each of those sub-delay switches 214 to close (or remain closed). Additionally, in the illustrative embodiment, the control circuitry sends appropriate control signals to any sub-delay switch(es) 214 that is/are nearer to the selected main switch 206A than the selected sub-delay switch 214 to cause each of those sub-delay switches 214 to open (or remain open). In the illustrative embodiment, the control circuitry also provides appropriate control signals to all sub-delay switches 214 of each variable delay module 208 that is not directly connected to the selected main switch (in this example, variable delay modules 208B, 208N) to cause all of those sub-delay switches 214 to close (or remain closed).

When the programmable reflective load line 104 is so configured (as shown in FIG. 3A and described above), a signal received at the input 114 will be transmitted along the signal path 300. First, the signal will travel from the input 114 through each main delay segment 200 that is arranged between the input 114 and the selected main switch 206A. In this example, only main segment 200A (and neither of main segments 200B, 200N) is on signal path 300. Second, the signal will travel through the selected main switch 206A. Third, the signal will travel through each sub-delay segment (of the inductive coil 212) that is arranged between the selected main switch 206A and the selected sub-delay switch 214. For example, with reference to FIG. 2, if the selected sub-delay switch was sub-delay switch 214A of variable delay module 208A, then the signal would travel only along sub-delay segment 212A (and not on any of sub-delay segments 212B, 212C, 212D). Fourth, the signal will travel through the selected sub-delay switch 214 to ground. Upon reaching ground, the signal will reflect and then travel back along the reverse path (in this example, through the selected sub-delay switch 214A, through the sub-delay segment 212A, through the main switch 206A, through the selected main delay segment 200A, to the input 114).

As another example, to program the signal path 302 through the programmable reflective load line 104 (see FIGS. 2 and 3B), the associated control circuitry supplies a different set of control signals. In this example, the main switch 206B is the selected main switch through which the signal path 302 will pass. In the illustrative embodiment, the control circuitry sends appropriate control signals to the selected main switch 206B and to any other main switch(es) that is/are further away from the input 114 (here, main switch 206N) to cause each of those main switches to close (or remain closed). Additionally, in the illustrative embodiment, the control circuitry sends appropriate control signals to any main switch(es) that is/are nearer to the input 114 (here, main switch 206A) to cause each of those main switches to open (or remain open).

As discussed above, the control circuitry also provides control signals to at least the sub-delay switches 214 of the variable delay module 208 that is directly connected to the selected main switch (in this example, variable delay module 208B directly connected to main switch 206B). For instance, with reference back to FIG. 2, the sub-delay switch 214C of the variable delay module 208B may be chosen as the selected sub-delay switch through which the signal path 302 will pass. The control circuitry sends an appropriate control signal to the selected sub-delay switch 214C to cause it to close (or remain closed). In the illustrative embodiment, the control circuitry also sends appropriate control signals to any other sub-delay switch(es) 214 that is/are further away from the selected main switch 206B than the selected sub-delay switch 214 to cause them to close (or remain closed; there are no such switches in FIG. 2). Additionally, in the illustrative embodiment, the control circuitry sends appropriate control signals to any sub-delay switch(es) 214 that is/are nearer to the selected main switch 206B than the selected sub-delay switch 214C to cause each of those sub-delay switches 214A, 214B to open (or remain open). In the illustrative embodiment, the control circuitry also provides appropriate control signals to all sub-delay switches 214 of each variable delay module 208 that is not directly connected to the selected main switch (in this example, variable delay modules 208A, 208N) to cause all of those sub-delay switches 214 to close (or remain closed), as illustrated in FIG. 2.

Figure 3B:
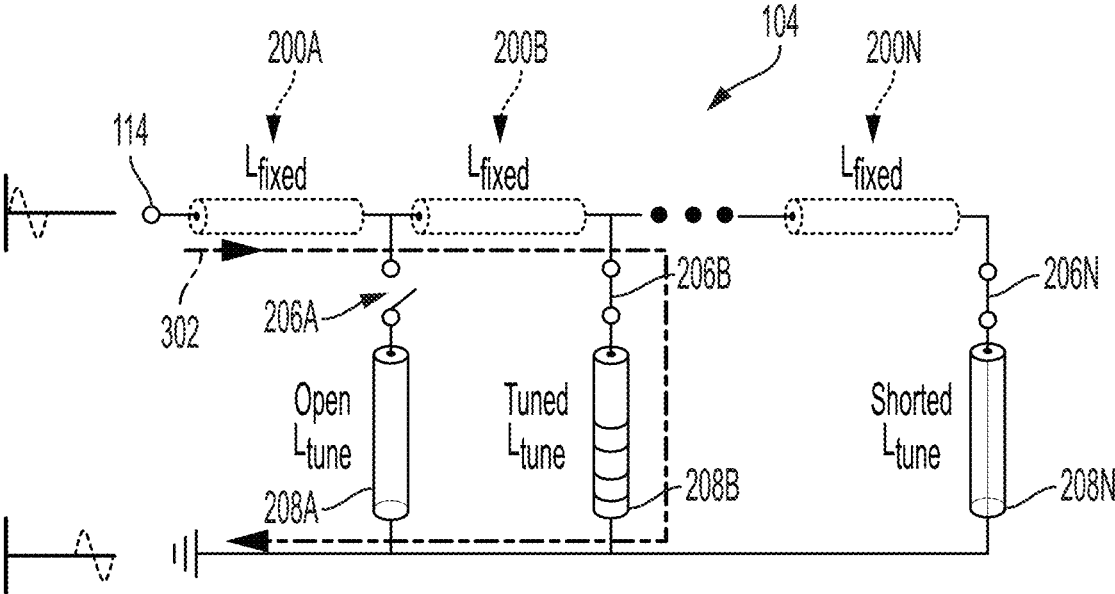
FIG. 3B is a simplified block diagram illustrating one longer signal path through one of the programmable reflective load lines of FIG. 1.

When the programmable reflective load line 104 is so configured (as shown in FIGS. 2 and 3B and described above), a signal received at the input 114 will be transmitted along the signal path 302. First, the signal will travel from the input 114 through each main delay segment 200 that is arranged between the input 114 and the selected main switch 206B. In this example, each of main segment 200A and main segment 200B (but not main segment 200N) is on signal path 302. Second, the signal will travel through the selected main switch 206B. Third, the signal will travel through each sub-delay segment (of the inductive coil 212) that is arranged between the selected main switch 206B and the selected sub-delay switch 214C. As illustrated in FIG. 2, if the selected sub-delay switch is sub-delay switch 214C of variable delay module 208B, then the signal would travel along sub-delay segment 212A, sub-delay segment 212B, and sub-delay segment 212C (but not sub-delay segment 212D). Fourth, the signal will travel through the selected sub-delay switch 214C to ground. Upon reaching ground, the signal will reflect and then travel back along the reverse path (in this example, through the selected sub-delay switch 214C, through the sub-delay segments 212C, 212B, 212A, through the selected main switch 206B, through the main delay segments 200B, 200A, to the input 114).

In the illustrative embodiment, each of the main segments 200 is longer than each of the sub-delay segments 212, such that changing the number of main segments 200 in the signal path provides larger adjustments to the time delay provided by the programmable reflective load lines 104A, 104B of the RTPS 100, while changing the number of sub-delay segments 212 in the signal path provides smaller adjustments to the time delay. In the illustrative embodiment, the control circuitry may also provide control signals to the tunable capacitances 220 of the programmable reflective load lines 104A, 104B, in order to fine tune the time delay (e.g., in phase increments under 1°). In the illustrative embodiment, the control circuitry provides the same set of control signals to both programmable reflective load lines 104A, 104B of the RTPS 100, such that the signal paths through the programmable reflective load lines 104A, 104B are the same length. In other words, the number of main delay segments 200 of the programmable reflective load line 104A arranged between the input 114A and the selected main switch 206 of the programmable reflective load line 104A will be equal to the number of main delay segments 200 of the programmable reflective load line 104B arranged between the input 114B and the selected main switch 206 of the programmable reflective load line 104B. Similarly, the number of sub-delay segments 212 of the programmable reflective load line 104A arranged between the selected main switch 206 and the selected sub-delay switch 214 of the programmable reflective load line 104A will be equal to the number of sub-delay segments 212 of the programmable reflective load line 104B arranged between the selected main switch 206 and the selected sub-delay switch 214 of the programmable reflective load line 104B.

Figure 4:
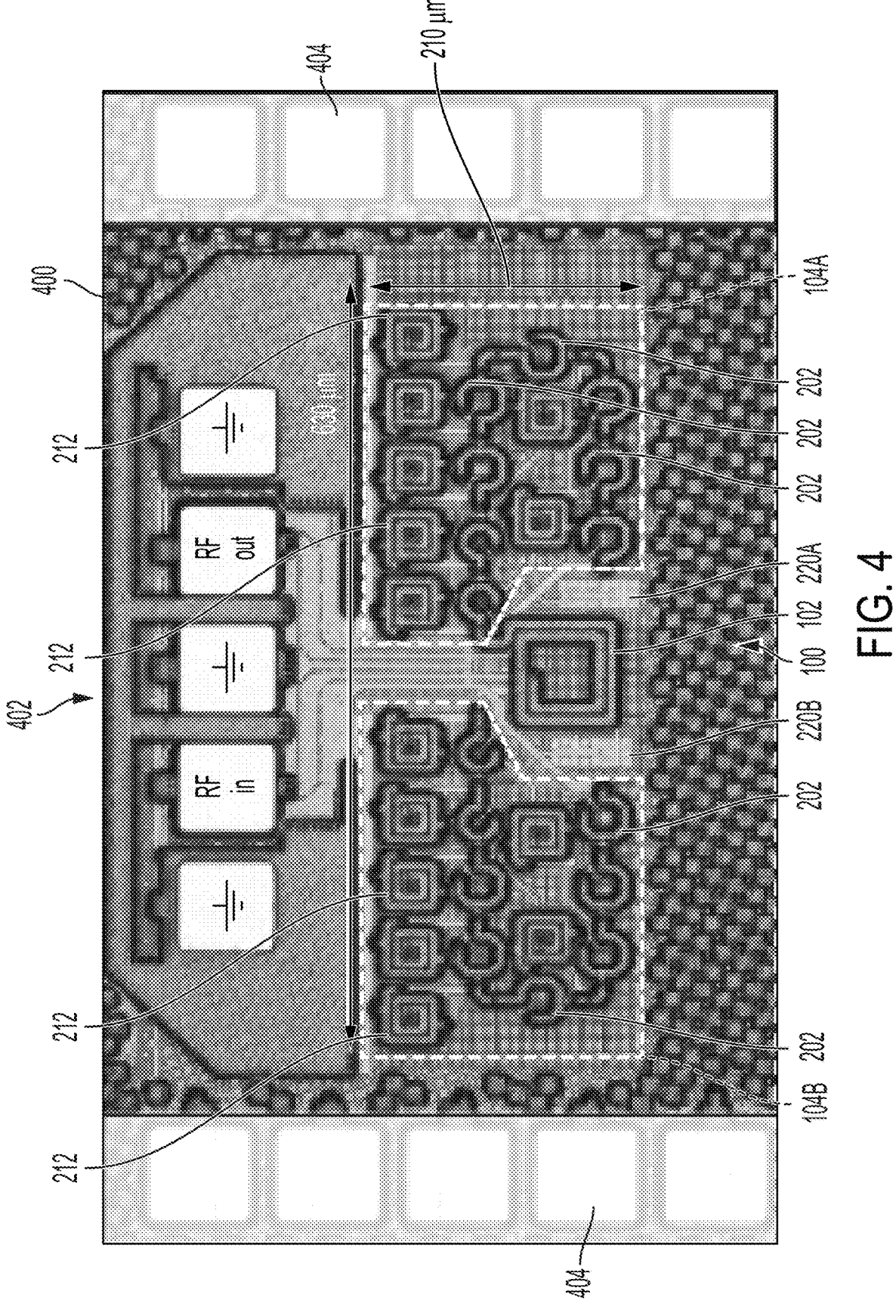
FIG. 4 is a top view of one illustrative embodiment of integrated circuit including the RTPS of FIG. 1.

FIG. 4 is a top view of one illustrative embodiment of integrated circuit 400 including the RTPS 100 described above (with reference to FIGS. 1-3). In the illustrative embodiment, the integrated circuit 400 is fabricated in 45-nm CMOS technology. The integrated circuit 400 includes radio frequency (RF) input/output pads 402 arranged in a ground-signal-ground-signal-ground (GSGSG) coplanar waveguide configuration. The RF input/output pads 402 are electrically connected to the input port 106 and the output port 108 of the 90° hybrid coupler 102. As described above, the coupled port 110 of the hybrid coupler 102 is electrically connected to the input 114A of the programmable reflective load line 104A, while the through port 112 of the hybrid coupler 102 is electrically connected to the input 114B of the programmable reflective load line 104B. As can be seen in FIG. 4, in the illustrative embodiment, each of the programmable reflective load lines 104A, 104B occupies an area of less than 0.1 mm$^2$ of the integrated circuit 400. In this embodiment, each programmable reflective load line 104A, 104B has an area of about 0.06 mm$^2$, and the hybrid coupler 102 occupies are area of only about 0.007 mm$^2$, meaning that the entire RTPS 100 occupies an area of only about 0.13 mm$^2$ of the integrated circuit 400. Each of the hybrid coupler 102, the programmable reflective load line 104A, and the programmable reflective load line 104B has a sub-wavelength footprint (i.e., a footprint smaller than the wavelength of the signals time-delayed by the RTPS 100).

In the illustrative embodiment of FIG. 4, each of the programmable reflective load lines 104A, 104B has eight main delay segments 200, which each provide about 20° of selectable phase shift at the midband frequency (here, 17 GHz). A top portion of the fixed inductance 202 (embodied as a two-layer inductor) of each of the eight main delay segments 200 of each programmable reflective load line 104A, 104B is visible in the top view of the integrated circuit 400 shown in FIG. 4. Each of the programmable reflective load lines 104A, 104B in this embodiment also has seven main switches 206, and selective shorting of the main delay line to ground through one of these main switches 206 determines the coarse-delay provided by the programmable reflective load lines 104A, 104B.

Each of the programmable reflective load lines 104A, 104B in this embodiment also has seven variable delay modules 208, each connected to one of the seven main switches 206 of that line (with the last main delay segment 200H of each line terminating at a ground connection, rather than another main switch and variable delay module). A top portion of the inductive coil 212 of each of the seven variable delay modules 208 of each programmable reflective load line 104A, 104B is visible in the top view of the integrated circuit 400 shown in FIG. 4. In this illustrative embodiment, each of the seven variable delay modules 208 includes seven sub-delay switches 214 connected at various points along the associated inductive coil 212 to divide it into eight sub-delay segments 212, which each provide about 2-3° of selectable phase shift at midband. Selective shorting of the inductive coil 212 of the activated variable delay module 208 to ground through one of these sub-delay switches 214 determines the medium-delay provided by the programmable reflective load lines 104A, 104B.

In the illustrative embodiment of FIG. 4, each of the programmable reflective load lines 104A, 104B also has a small tunable capacitance 220 of about 30-60 femtofarads to facilitate continuous phase tuning with sub-1° resolution (though this is not the primary tuning mechanism). Tuning of the capacitance 220 determines the fine-delay provided by the programmable reflective load lines 104A, 104B. Top portions of the tunable capacitance 220A associated with the programmable reflective load lines 104A and of the tunable capacitance 220B associated with the programmable reflective load lines 104B are visible in the top view of the integrated circuit 400 shown in FIG. 4. The integrated circuit 400 also includes digital input pads 404 for receiving the bits of one or more digital inputs (representing, for example, a desired time delay to be provided by the RTPS 100), which the control circuitry of the integrated circuit 400 translates into appropriate control signals to be provided to the main switches 206, the sub-delay switches 214, and the tunable capacitances 220 of the programmable reflective load lines 104A, 104B.

Figure 5:
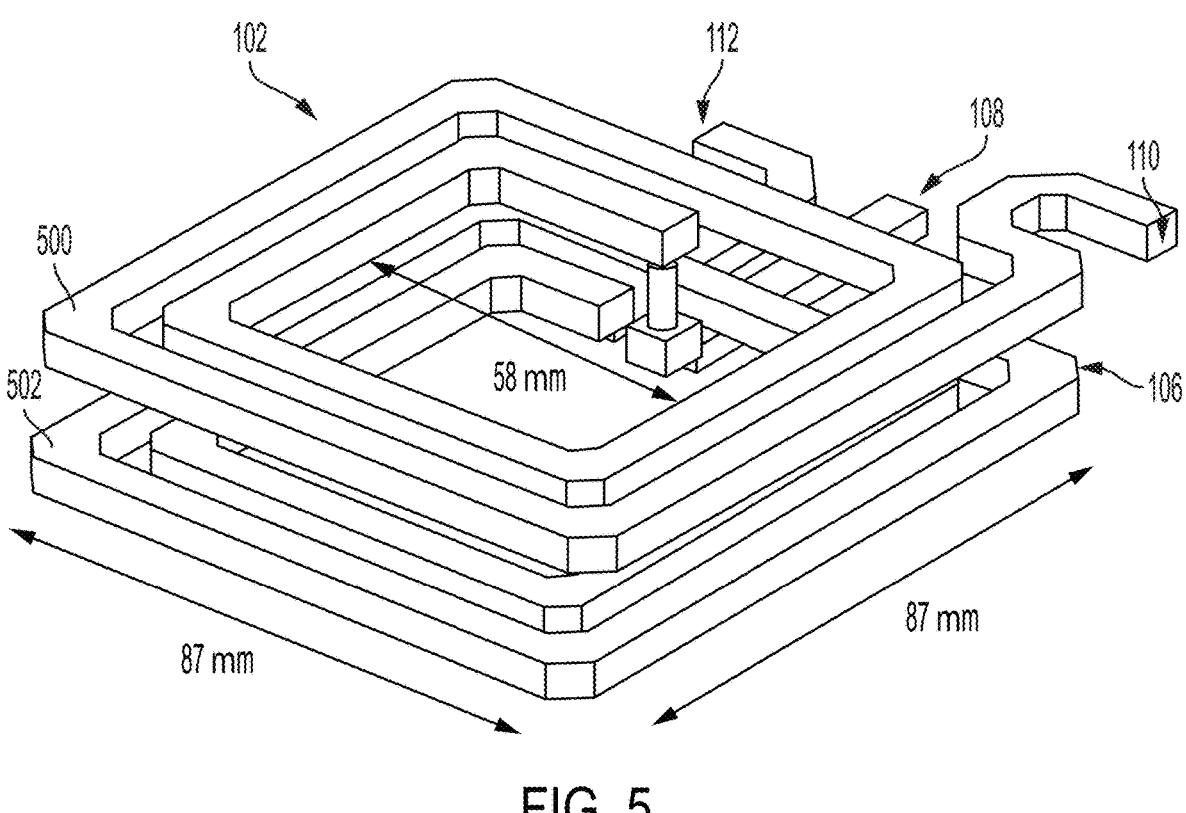
FIG. 5 is an exploded view of vertically stacked coils of the hybrid coupler of FIG. 4.

FIG. 5 is an exploded view of vertically stacked coils 500, 502 of the hybrid coupler 102 of FIG. 4. In the illustrative embodiment, the 90° hybrid coupler 102 includes an upper inductor 500 that is implemented in a first metal layer of the CMOS process stack. This upper inductor 500 is visible in the top view of the integrated circuit 400 in FIG. 4. The 90° hybrid coupler 102 also includes a lower inductor 502 that is implemented in a second metal layer of the CMOS process stack, which is separated from the first metal layer by dielectric. In the illustrative embodiment, the inductor 500 is formed in an aluminum layer with a height of 4.0 μm, the inductor 502 is formed in a copper layer with a height of 3.1 μm, and both have outer length and width dimensions of 87 μm. In this embodiment, the hybrid coupler 102 achieves an inductive coupling coefficient (k) of approximately 0.83 between the inductors 500, 502, providing broadband coupling action in just 0.007 mm$^2$ of chip area.

Figure 6:
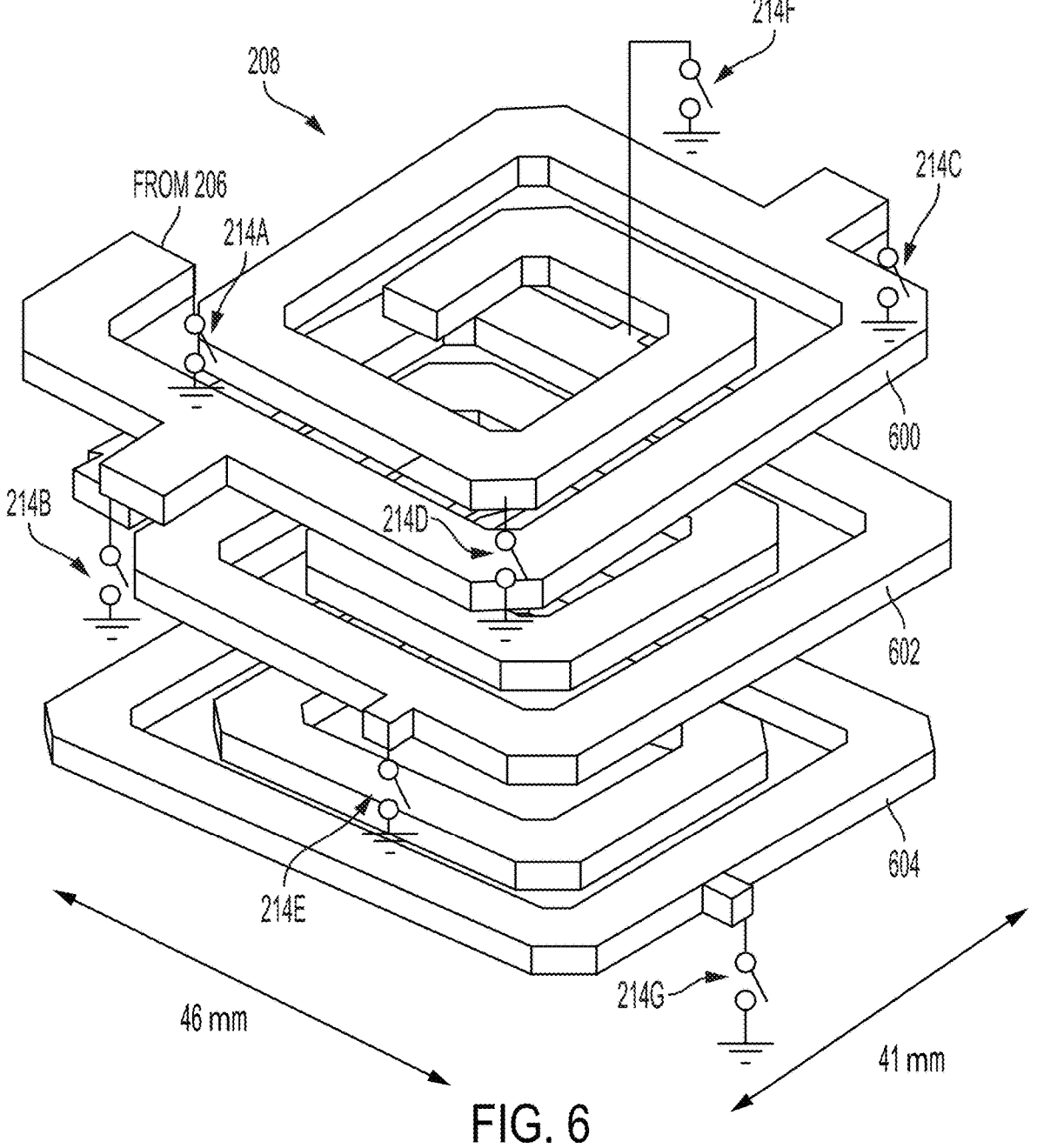
FIG. 6 is an exploded view of vertically stacked coils of a variable delay module of one of the programmable reflective load lines of FIG. 4.

FIG. 6 is an exploded view of each of the variable delay modules 208 of the programmable reflective load lines 104A, 104B of FIG. 4. In the illustrative embodiment, each variable delay module 208 includes an upper coil 600 that is implemented in the first metal layer of the CMOS process stack. The upper coils 600 of each of fourteen variable delay modules 208 are visible in the top view of the integrated circuit 400 in FIG. 4. Each variable delay module 208 also includes a middle coil 602 that is implemented in the second metal layer of the CMOS process stack, which is separated from the first metal layer by dielectric. A conductive via formed through this dielectric connects an end of the upper coil 600 to one end of the middle coil 602. Each variable delay module 208 further includes a lower coil 604 that is implemented in a third metal layer of the CMOS process stack, which is separated from the second metal layer by dielectric. A conductive via formed through this dielectric connects another end of the middle coil 602 to one end of the lower coil 604. Another end of the lower coil 604 is shorted to ground. Together, the connected coils 600, 602, 604 form a three-dimensional inductive coil 212 of the variable delay module 208. In the illustrative embodiment, the upper coil 600 is formed in the 4.0 μm thick aluminum layer, the middle coil 602 is formed in the 3.1 μm thick copper layer, the lower coil 604 is formed in another 3.1 μm thick copper layer, and each has outer length and width dimensions of 46 μm and 41 μm. It is contemplated that more than three metal layers of a semiconductor process stack could be used in other embodiments. As suggested diagrammatically in FIG. 6, seven sub-delay switches 214A, 214B, 214C, 214D, 214E, 214F, 214G are electrically connected at various nodes 216 along the length of this inductive coil 212, effectively dividing it into eight sub-delay segments (not labelled in FIG. 6). Each of the coils 600, 602, 604 has dimensions of 46 μm×41 μm in the illustrative embodiment.

Figure 7:
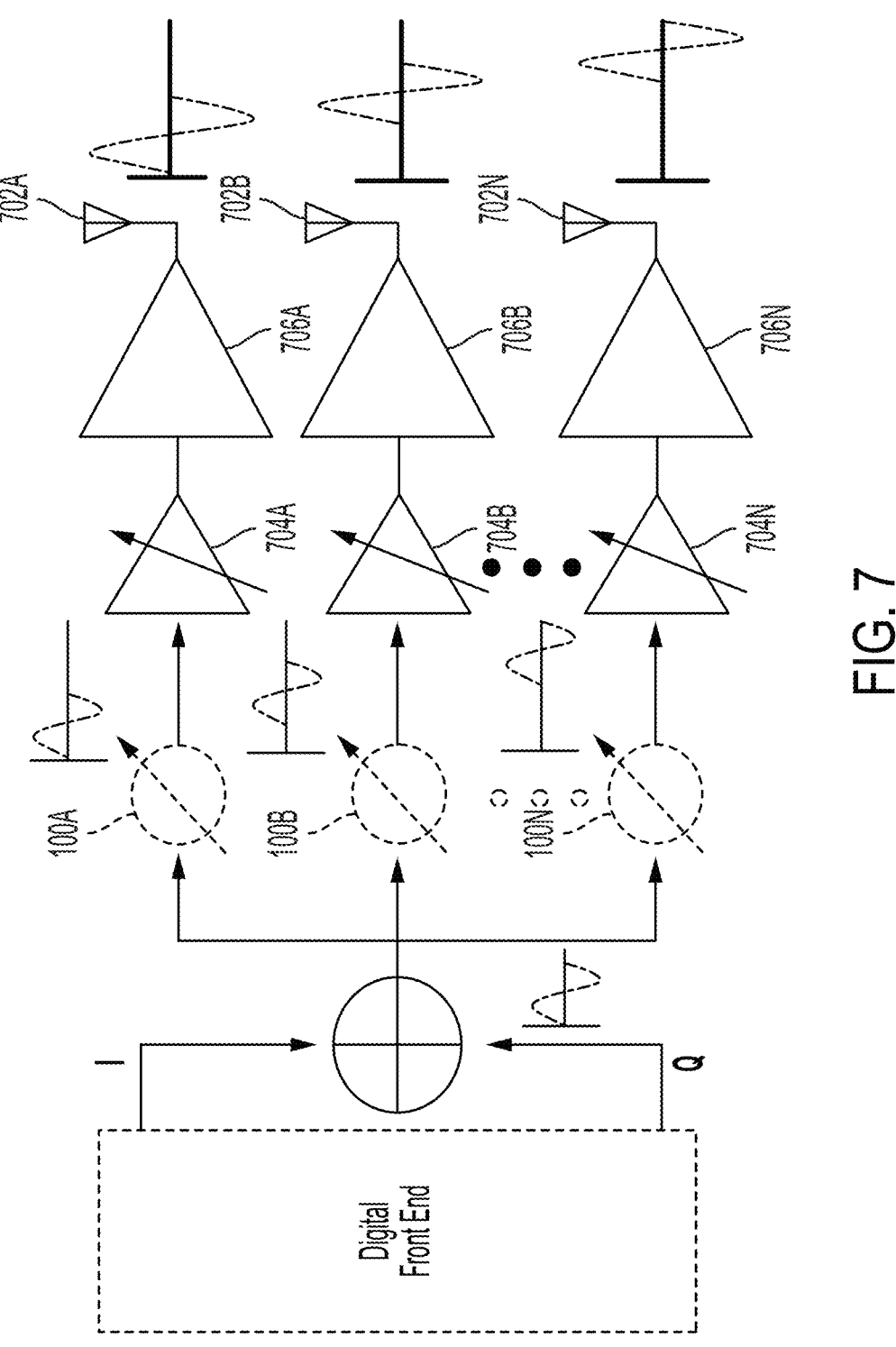
FIG. 7 is a simplified block diagram illustrating signal flow through an array of transmitter modules with RTPS according to the present disclosure and an array of antennas for beamforming.

In some embodiments, the RTPS 100 (including the hybrid coupler 102, the programmable reflective load line 104A, the programmable reflective load line 104B, and the associated control circuity) may form part of a transmitter module, and an integrated circuit may comprise an array of such transmitter modules. FIG. 7 is a simplified block diagram illustrating signal flow through an array of transmitter modules that are electrically connected to an array of antennas 702A, 702B, . . . 702N for beamforming. This apparatus is configured to introduce varying amounts of time delay to copies of a radio signal using the array of transmitter modules such that the time-delayed copies of the radio signal transmitted from the array of antennas 702A, 702B, . . . 702N form a beam. While three transmitter modules are shown in FIG. 7, the array may include any number of transmitter modules, within applicable space constraints. Initially, the radio signal is split, and each component is fed to a different RTPS 100A, 100B, . . . 100N. As shown in FIG. 7, RTPS 100A introduces a smaller amount of time delay to the signal, while RTPS 100B introduces a moderate amount of time delay to the signal, and RTPS 100N introduces a larger amount of time delay to the signal. The signal output by RTPS 100A is fed through variable game amplifier 704A to equalize variations in loss and then through power amplifier 706A to boost the signal before radiation by antenna 702A. Similarly, the signal output by RTPS 100B is fed through variable game amplifier 704B and power amplifier 706B before radiation by antenna 702B, and the signal output by RTPS 100N is fed through variable game amplifier 704N and power amplifier 706N before radiation by antenna 702N. Although the relationship between delay resolution and beamsteering angle resolution is contingent on the pattern of antenna spacing in an array, increasing the resolution of the delay element (via the presently disclosed RTPS 100) generally gives finer control over the phase/time-delay differences applied to individual antennas.

FIGS. 8A-C are simplified block diagrams of portions of the control circuitry of the integrated circuit 400 of FIG. 4. FIGS. 8A and 8B illustrate thermometer decoder logic circuits 810, 812 each comprising eleven NOT gates (inverters) 800, four NOR gates 802, and four NAND gates 804 (only some of which are labeled in FIGS. 8A and 8B). The logic circuit 810 (FIG. 8A) is used to decode an input of three digital bits (MB2, MB1, MB0), representing the position of the selected main switch 206 through which the signal path is to pass, into control signals for the seven main switches 206 of each programmable reflective load line 104A, 104B. Each output of the logic circuit 810 is provided to a gate of one of the seven main switches 206 of each programmable reflective load line 104A, 104B, with the MS0 output controlling the main switch 206A closest to the input 114 and the MS6 output controlling the main switch 206G furthest from the input 114.

The logic circuit 812 (FIG. 8B) is used to decode an input of three digital bits (SB2, SB1, SB0), representing the position of the selected sub-delay switch 214 through which the signal path is to pass, into control signals for the seven sub-delay switches 214 of each variable delay module 208 of each programmable reflective load line 104A, 104B. Each output of the logic circuit 812 is provided to a gate of one of the seven sub-delay switches 214 of each variable delay module 208 of each programmable reflective load line 104A, 104B, with the SSC0 output going to the sub-delay switch 214A closest to the associated main switch 206 and the SSC6 output going to the sub-delay switch 214G furthest from the associated main switch 206. In the illustrative embodiment, each variable delay module 208 receives both the control signals output by the logic circuit 812 and a module-specific control signal from the logic circuit 814 of FIG. 8C. At each variable delay module 208, the control signal from logic circuit 814 is combined with each of the control signals from logic circuit 812 before they are provided the sub-delay switches 214. For all variable control modules 208 except the one associated with the selected main switch 206, the logic circuit 814 provides a high voltage (close) signal that overrides any low voltage (open) signal(s) from the logic circuit of FIG. 8B and therefore closes all sub-delay switches 214 of those variable delay modules 208. The logic circuit of FIG. 8C is illustratively embodied as a 3-to-8-bit 1-hot decoder, with the same 3-bit input as the logic circuit 810 and with one unused output.

As one example, if the control circuitry received a MS digital input of [011] (representing a signal path through the third main switch 206C) and a SS digital input of [010] (representing a signal path through the second sub-delay switch 214B of the corresponding variable delay module 208C), then an MB2 value of 0, an MB1 value of 1, and an MB2 value of 1 would be supplied to the appropriate inputs of the logic circuit 810 and of the logic circuit 814, while an SB2 value of 0, an SB1 value of 1, and an SB2 value of 0 would be supplied to the appropriate inputs of the logic circuit 812. The logic circuit 810 would output [0011111], the logic circuit 812 would output [0111111], and the logic circuit 814 would output [1101111]. The multiplexing of the outputs of the logic circuits 812, 814 causes the sub-delay switches 214 in the variable delay modules 208A, 208B, 208D, 208E, 208F, 208G to receive [1111111] as their SS control signals, while variable delay module 208C receives [0111111] as its SS control signals.

The presently disclosed Q-TTD are capable of providing a delay-to-area ratio greater than 160 ps/mm$^2$, much higher than prior art phase shifters and TTD. As a result, the channel capacity of an on-chip array can be substantially increased if constructed from densely arranged Q-TTD elements. FIGS. 9A-11C compare the projected performance of linear arrays of a prior art phase shifter (from Koh et al., "0.13-µm CMOS phase shifters for X-, Ku-, and K-band phased arrays," IEEE J. Solid-State Circuits (2007), volume 42, pages 2535-2546), of a prior art TTD (from Jung et al., "A compact 3-30-GHz 68.5-ps CMOS true-time delay for wideband phased array systems," IEEE Trans. Microw. Theory Tech. (2020), volume 68, pages 5371-5380), and of the presently disclosed Q-TTD. In each case, the linear array was limited to the number of corresponding delay elements that could fit within a chip area constraint of 2.1 mm$^2$.

Figures 9A, 9B, 9C, 10A, 10B, 10C:
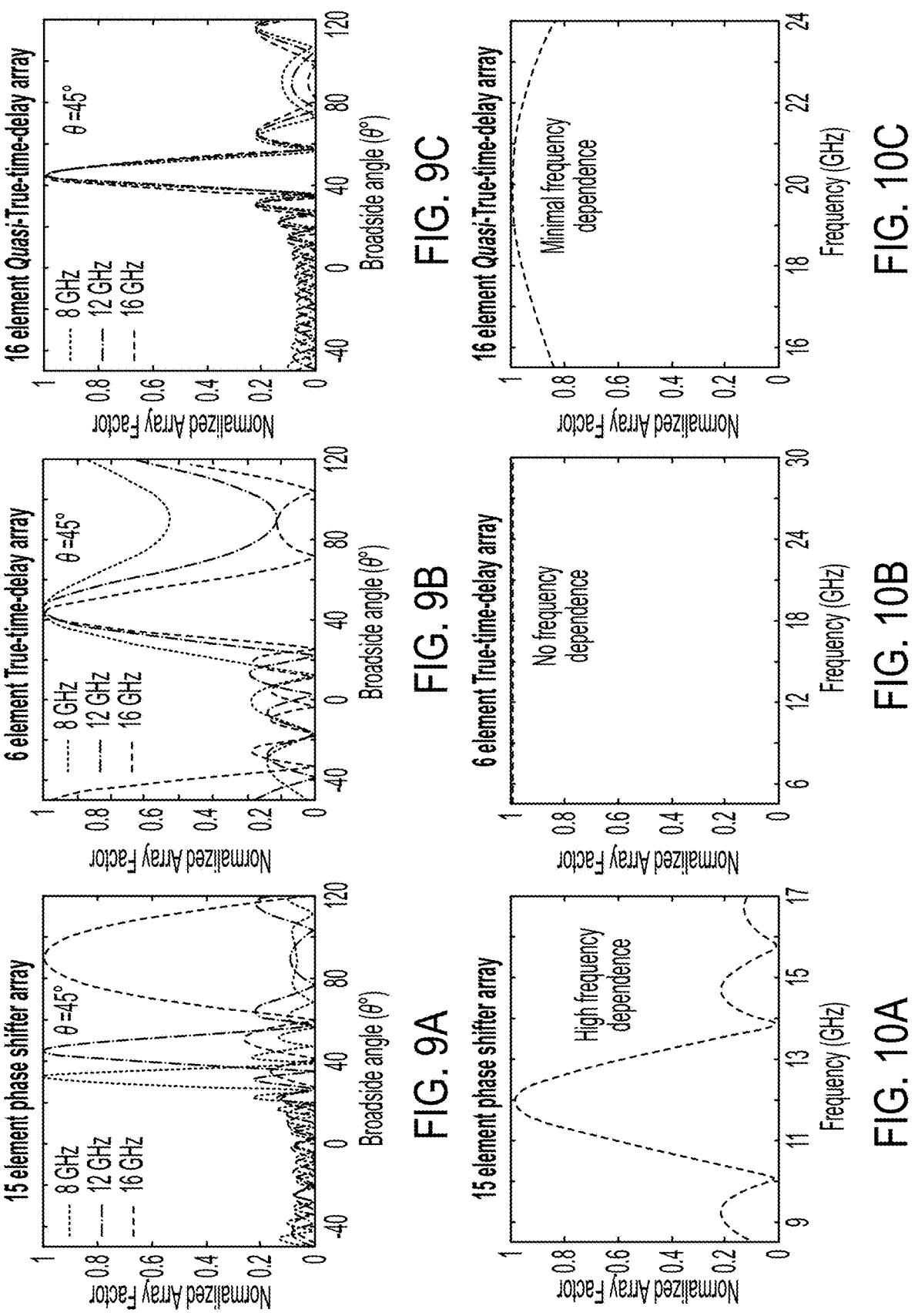
FIG. 9A is a graph illustrating the normalized array factor of a 15-element array of a prior art phase shifter as a function of broadside angle.
FIG. 9B is a graph illustrating the normalized array factor of a 6-element array of a prior art true time delay as a function of broadside angle.
FIG. 9C is a graph illustrating the normalized array factor of a 16-element array of the presently disclosed quasi true time delay as a function of broadside angle.
FIG. 10A is a graph illustrating the normalized array factor of the 15-element array of the prior art phase shifter as a function of signal frequency.
FIG. 10B is a graph illustrating the normalized array factor of the 6-element array of the prior art true time delay as a function of signal frequency.
FIG. 10C is a graph illustrating the normalized array factor of the 16-element array of the presently disclosed quasi true time delay as a function of signal frequency.

For the prior art phase shifter, a chip area of 2.1 mm$^2$ could accommodate a 15-element linear array. As shown in FIGS. 9A and 10A, this phased array exhibits high frequency dependence and poorly directs a signal that is offset from its midband frequency (12 GHz), causing severe beam squint. With the chip area constraint of 2.1 mm$^2$, a 6-element linear array of the prior art true time delay was possible. As shown in FIGS. 9B and 10B, while this TTD array can direct all frequencies accurately, it has substantially less gain owing to the small number of delay elements on the chip. For the presently disclosed quasi true time delay, a linear array of 16 elements is possible within 2.1 mm$^2$ of chip area. As will be appreciated from FIGS. 9C and 10C, the Q-TTD array sharply directs all frequencies across a 14-24 GHz range in the target direction with minimal dispersion, achieving a normalized array factor of at least 0.8 across more than 8 GHz of bandwidth.

Figures 11A, 11B, 11C:
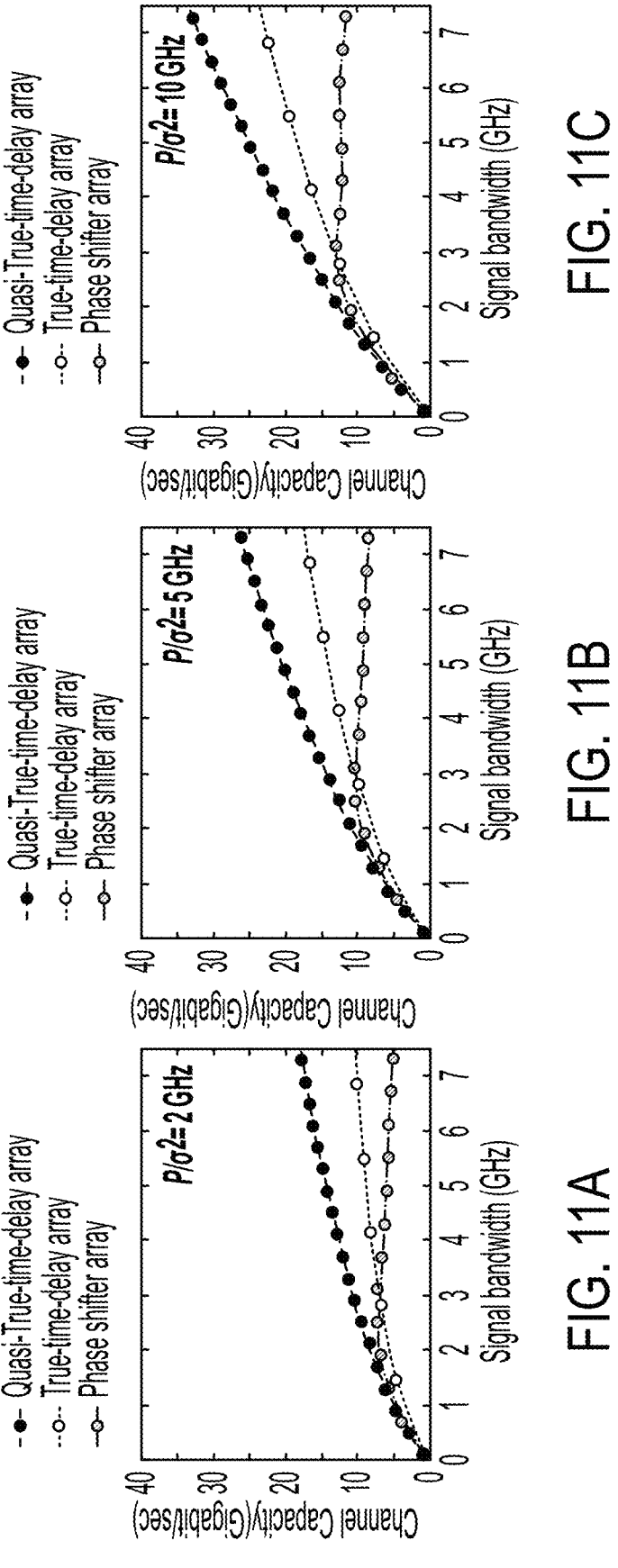
FIG. 11A is a graph comparing the channel capacities of the 15-element array of the prior art phase shifter, the 6-element array of the prior art true time delay, and the 16-element array of the presently disclosed quasi true time delay as a function of signal bandwidth for a signal-to-noise-density ratio of 2 GHz.
FIG. 11B is a graph comparing the channel capacities of the 15-element array of the prior art phase shifter, the 6-element array of the prior art true time delay, and the 16-element array of the presently disclosed quasi true time delay as a function of signal bandwidth for a signal-to-noise-density ratio of 5 GHz.
FIG. 11C is a graph comparing the channel capacities of the 15-element array of the prior art phase shifter, the 6-element array of the prior art true time delay, and the 16-element array of the presently disclosed quasi true time delay as a function of signal bandwidth for a signal-to-noise-density ratio of 10 GHz.

FIGS. 11A-C demonstrate the superior channel-capacity of the presently disclosed Q-TTD array, as compared to the prior art phased array and prior art TTD array described above. Typical phase shifters, despite their dense packing, have a small bandwidth over which group velocity is maintained constant and this limits their channel-capacity. TTD elements are too bulky, resulting in an integrated circuit with reduced channel-capacity. Q-TTD elements, however, have a miniature footprint and retain a constant group delay across an ultra-broad bandwidth, giving much greater wireless channel-capacity, as much as 33 Gigabits per second with a signal bandwidth over 7 GHz and a signal-to-noise-density ratio of 10 GHz (see FIG. 11C).

Figures 1, 12A, 12B:
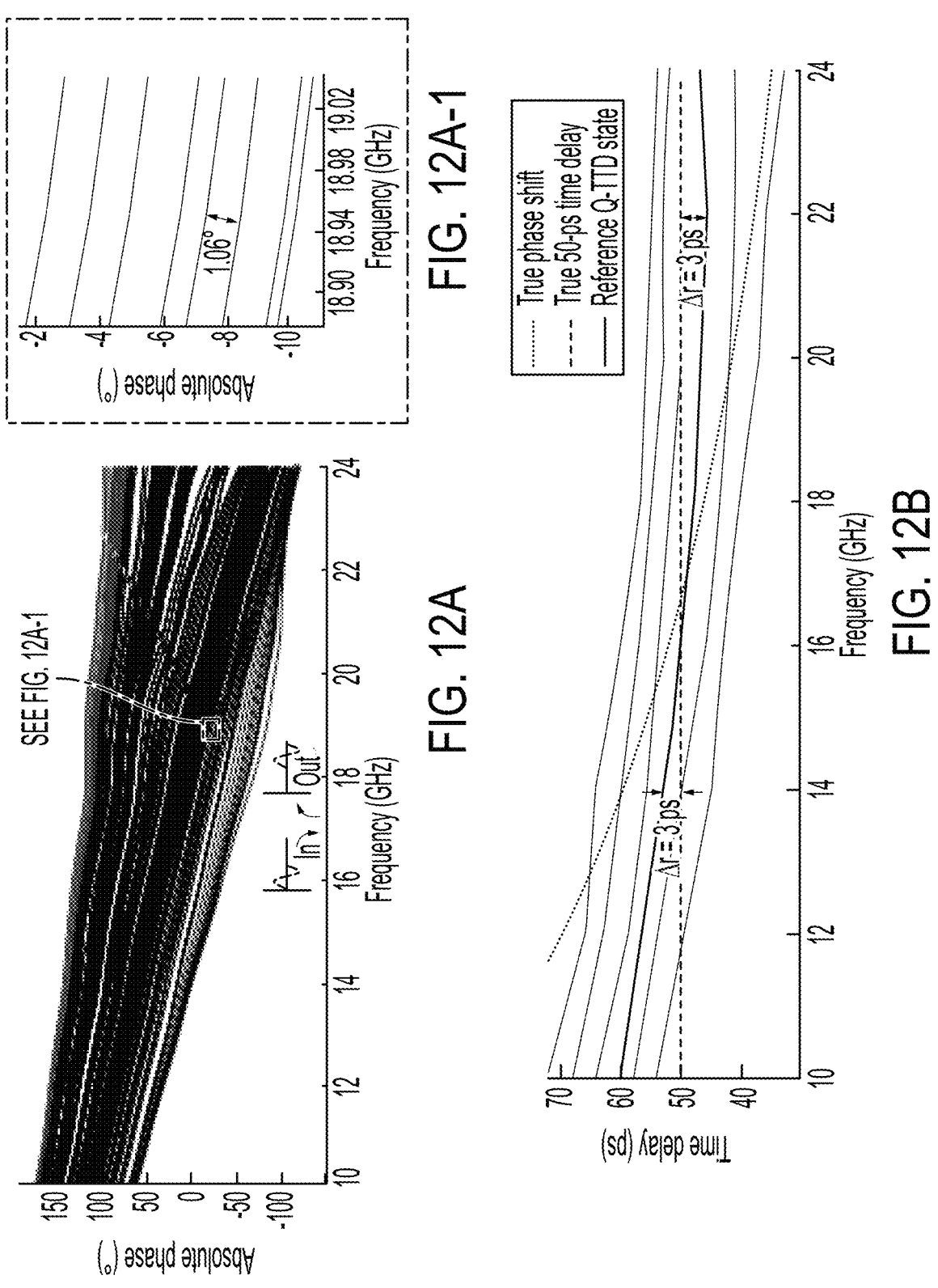
FIG. 12A is a graph illustrating measured broadband phase shift performance of the quasi true time delay of FIG. 4 in 150 representative states.
FIG. 12B is a graph illustrating measured broadband time delay performance of the quasi true time delay of FIG. 4 in six representative states, with comparative traces for true phase shift and 50 picosecond (ps) TTD.

FIGS. 12A and 12B show measured broadband phase shift and time-delay performance of the illustrative embodiment of the Q-TTD shown in FIG. 4. To generate FIG. 12A, the Q-TTD was configured in 150 different states, using 50 different groups of main and sub-delay switch settings, each with three different trim capacitor settings, covering an average tuning range of 184° across the band from 10 GHz to 24 GHz. (Although 10 GHz to 24 GHz is an optimal frequency range for this embodiment, it is contemplated that other embodiments could handle signals in different ranges from 500 MHz up to 50 GHz.) The phase expansion with increasing frequency that is seen in FIG. 12A is indicative of TTD. Phase tuning covering a range of at least 180° range allows the presently disclosed Q-TTD to be used for beam scanning. A small portion of FIG. 12A is shown in greater detail in FIG. 12A-1, which illustrates that approximately 1° fine-tuning resolution is made possible by incremental adjustments in return-path length and small adjustments in fine-trim varactors.

The measured time delay of the Q-TTD of FIG. 4 is shown for six representative coarse-delay states (achieved by engaging different main switches with the shortest sub-delay path to ground, giving 4 picoseconds of coarse resolution) in the graph of FIG. 12B. As shown in that graph, the illustrative embodiment of the Q-TTD better approximates a constant time delay over a much wider bandwidth than a prior art phase shifter. Using a TTD that produces 50 ps of time delay at 17 GHz (midband) as reference, the variation in time delay ($\Delta\tau$) of the Q-TTD is less than 3 ps across a 14-24-GHz frequency range. This deviation is much smaller than that given by a pure phase shifter (dashed line), whose variation exceeds 15 ps (that is, five times greater variation) across this same frequency range.

Figures 13A, 13B:
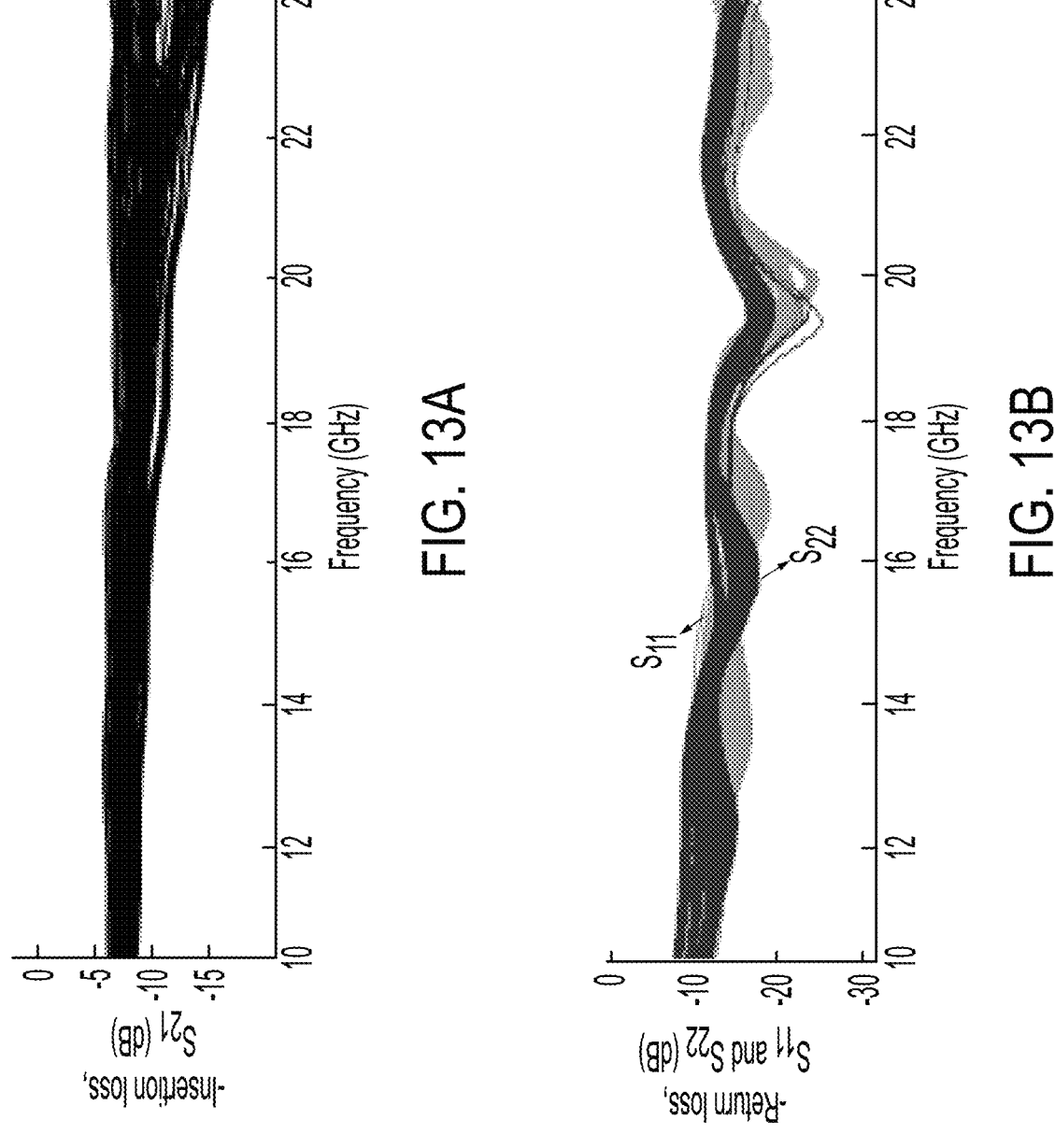
FIG. 13A is a graph illustrating measured insertion loss of the quasi true time delay of FIG. 4.
FIG. 13B is a graph illustrating measured return loss of the quasi true time delay of FIG. 4.

FIGS. 13A and 13B show measured insertion loss and return loss, respectively, for the illustrative embodiment of the Q-TTD shown in FIG. 4. As shown in the graph of FIG. 13A, the measured insertion loss (S21) of the Q-TTD averaged 8.1 dB across the band. This is competitive with state-of-the-art passive phase shifters and TTD elements. In beam-steering systems, the gradual variation in loss of the Q-TTD element across frequency would mean reduced complexity when using variable gain amplifiers and lookup tables for gain settings, in comparison with narrowband phase shifters. As shown in the graph FIG. 13B, the Q-TTD had input and output port return loss greater than 11 dB, showing broadband impedance matching to 50-$\Omega$ terminations across 25 GHz of bandwidth. In other words, the variation in coupling coefficients of the hybrid coupler 102 to its ports, with variation in load impedance, is negligible.

Figure 14B:
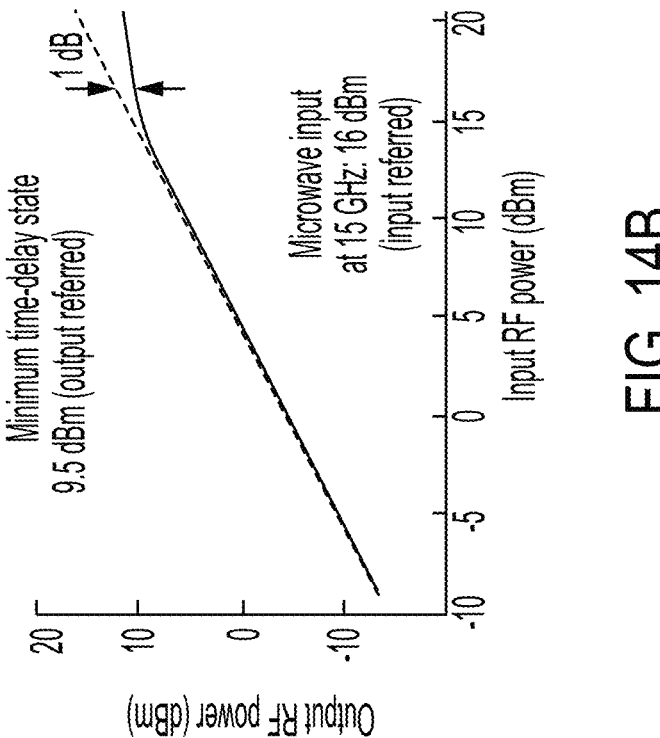
FIG. 14B is a graph illustrating measured RF power of the output signal from the quasi true time delay of FIG. 4 when RF power of the input signal was swept from low to high while the quasi true time delay was configured in a minimum time-delay state.
Figure 14A:
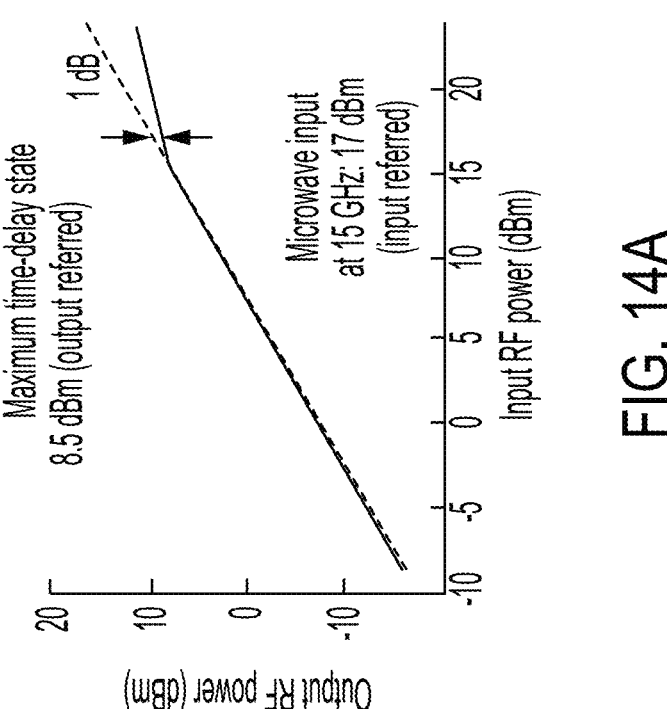
FIG. 14A is a graph illustrating measured RF power of an output signal from the quasi true time delay of FIG. 4 when RF power of an input signal was swept from low to high while the quasi true time delay was configured in a maximum time-delay state.

Additionally, to investigate the effect of transistor switches and varactor nonlinearity on the overall system, input RF power was swept from –10 dBm to 20 dBm, with output power monitored for nonlinear compression. This sweep is shown in FIGS. 14A and 14B for two different delay settings at 15 GHz: (1) a maximum time-delay state with the last coarse-delay section of each programmable reflective load line engaged (see FIG. 14A) and (2) a minimum time-delay state with the shortest possible path to ground through the programmable reflective load lines (see FIG. 14B). Each graph includes a dashed line showing the ideal linear input-output relationship for comparison. This linear relationship held steady until a large input power of 16-17 dBm. The "gain" then compressed primarily because of the nonlinearity of the switches. The input-referred 1-dB compression point ($P_{1\,dB}$) is 17 dBm, and the output-referred 1-dB compression point is 9 dB, which exceeds the highest reported CMOS phase-shifter compression-point metrics.

While the disclosure has been illustrated and described in detail in the drawings and foregoing description, such an illustration and description is to be considered as illustrative and not restrictive in character, it being understood that only illustrative embodiments have been shown and described and that all changes and modifications that come within the spirit of the disclosure are desired to be protected.

There are a plurality of advantages of the present disclosure arising from the various features of the apparatus and methods described herein. It will be noted that alternative embodiments of the apparatus and methods of the present disclosure may not include all of the features described yet still benefit from at least some of the advantages of such features. Those of ordinary skill in the art may readily devise their own implementations of the apparatus and methods that incorporate one or more of the features of the present invention and fall within the spirit and scope of the present disclosure as defined by the appended claims.

The invention claimed is:

1. Apparatus comprising:
an integrated circuit comprising a first programmable reflective load line, wherein the first programmable reflective load line comprises:
a first plurality of main delay segments arranged in series between a first input and ground;
a first plurality of variable delay modules arranged in parallel between (i) nodes adjoining the main delay segments of the first plurality of main delay segments and (ii) ground; and
a first plurality of main switches, wherein each main switch of the first plurality of main switches is arranged between (i) one of the first plurality of variable delay modules and (ii) one of the nodes adjoining the main delay segments of the first plurality of main delay segments;
wherein each variable delay module of the first plurality of variable delay modules comprises:
a plurality of sub-delay segments arranged in series between the associated main switch and ground; and
one or more sub-delay switches, wherein each sub-delay switch of the one or more sub-delay switches is arranged between (i) a node adjoining two of the associated plurality of sub-delay segments and (ii) ground.

2. The apparatus of claim 1, wherein the integrated circuit is implemented in a semiconductor process stack such that the first programmable reflective load line has a sub-wavelength footprint.

3. The apparatus of claim 2, wherein the plurality of sub-delay segments of each variable delay module of the first plurality of variable delay modules comprise vertically stacked coils formed in multiple metal layers of the semiconductor process stack.

4. The apparatus of claim 2, wherein the main switches of the first plurality of main switches increase in size with increasing distance from the first input along the first plurality of main delay segments.

5. The apparatus of claim 2, wherein:
the first plurality of main delay segments comprises eight main delay segments;
the first plurality of main switches comprises seven main switches;
the first plurality of variable delay modules comprises seven variable delay modules;
the plurality of sub-delay segments comprises eight sub-delay segments;
the one or more sub-delay switches comprise seven sub-delay switches; and
the first programmable reflective load line occupies an area of less than $0.1\ mm^2$ of the integrated circuit.

6. The apparatus of claim 1, wherein the integrated circuit further comprises control circuity configured to supply control signals to the first plurality of main switches and to the one or more sub-delay switches of each variable delay module of the first plurality of variable delay modules to program a first signal path through the first programmable reflective load line, the first signal path including at least one of the first plurality of main delay segments and at least one of the plurality of sub-delay segments of one of the first plurality of variable delay modules.

7. The apparatus of claim 6, wherein:

the integrated circuit further comprises a second programmable reflective load line, wherein the second programmable reflective load line comprises:

a second plurality of main delay segments arranged in series between a second input and ground;

a second plurality of variable delay modules arranged in parallel between (i) nodes adjoining the main delay segments of the second plurality of main delay segments and (ii) ground; and a second plurality of main switches, wherein each main switch of the second plurality of main switches is arranged between (i) one of the second plurality of variable delay modules and (ii) one of the nodes adjoining the main delay segments of the second plurality of main delay segments;

wherein each variable delay module of the second plurality of variable delay modules comprises:

a plurality of sub-delay segments arranged in series between the associated main switch and ground; and one or more sub-delay switches, wherein each sub-delay switch of the one or more sub-delay switches is arranged between (i) a node adjoining two of the associated plurality of sub-delay segments and (ii) ground; and the control circuity is further configured to supply control signals to the second plurality of main switches and to the one or more sub-delay switches of each variable delay module of the second plurality of variable delay modules to program a second signal path through the second programmable reflective load line, the second signal path including at least one of the second plurality of main delay segments and at least one of the plurality of sub-delay segments of one of the second plurality of variable delay modules.

8. The apparatus of claim 7, wherein:

the integrated circuit further comprises a hybrid coupler having (i) an input port, (ii) an output port, (iii) a coupled port electrically connected to the first input of the first programmable reflective load line, and (iv) a through port electrically connected to the second input of the second programmable reflective load line; and the control circuity is configured to program the first signal path through the first programmable reflective load line and the second signal path through the second programmable reflective load line such that the first and second signal paths provide a selected time delay for a signal received at the input port of the hybrid coupler and provided at the output port of the hybrid coupler.

9. The apparatus of claim 8, wherein:

the first programmable reflective load line further comprises a first tunable capacitance arranged between (i) a node adjoining the first input and the first plurality of main delay segments and (ii) ground;

the second programmable reflective load line further comprises a second tunable capacitance arranged between (i) a node adjoining the second input and the second plurality of main delay segments and (ii) ground; and the control circuity is further configured to control the first and second tunable capacitances to fine tune the time delay applied to the signal received at the input port of the hybrid coupler.

10. The apparatus of claim 9, wherein the hybrid coupler, the first programmable reflective load line, and the second programmable reflective load line together occupy an area of less than 0.15 mm$^2$ of the integrated circuit and provide phase resolution of under 1 degree.

11. The apparatus of claim 8, wherein the integrated circuit is implemented in a semiconductor process stack such that the hybrid coupler, the first programmable reflective load line, and the second programmable reflective load line each have a sub-wavelength footprint.

12. The apparatus of claim 11, wherein (i) the plurality of sub-delay segments of each variable delay module of the first plurality of variable delay modules, (ii) the plurality of sub-delay segments of each variable delay module of the second plurality of variable delay modules, and (iii) the hybrid coupler each comprise vertically stacked coils formed in multiple metal layers of the semiconductor process stack.

13. The apparatus of claim 8, wherein the hybrid coupler, the first programmable reflective load line, the second programmable reflective load line, and the control circuity form part of a transmitter module of the integrated circuit, and wherein the integrated circuit comprises an array of such transmitter modules.

14. The apparatus of claim 13, further comprising an array of antennas, wherein each antenna of the array of antennas is electrically connected to one of the transmitter modules of the array of transmitter modules, and wherein the integrated circuit is configured to introduce varying amounts of time delay to copies of a radio signal using the array of transmitter modules such that the time-delayed copies of the radio signal transmitted from the array of antennas form a beam.

15. The apparatus of claim 14, wherein the array of transmitter modules occupies an area of no more than 2.1 mm$^2$ of the integrated circuit and provides a normalized array factor of greater than 0.8 across at least 8 GHz of bandwidth.

16. A method comprising:

providing control signals to a first plurality of main switches arranged along a first programmable reflective load line of an integrated circuit to (i) open any main switch of the first plurality of main switches that is nearer to a first input of the first programmable reflective load line than a selected main switch of the first plurality of main switches and (ii) close the selected main switch and any main switch of the first plurality of main switches that is further from the first input than the selected main switch;

providing control signals to a first plurality of sub-delay switches of the first programmable reflective load line of the integrated circuit to (i) open any sub-delay switch of the first plurality of sub-delay switches that is nearer to the selected main switch of the first programmable reflective load line than a selected sub-delay switch of the first plurality of sub-delay switches and (ii) close the selected sub-delay switch and any sub-delay switch of the first plurality of sub-delay switches that is further from the selected main switch than the selected sub-delay switch; and transmitting a signal along the first programmable reflective load line, wherein the signal travels from the first input, through a number of main delay segments of the first programmable reflective load line arranged between the first input and the selected main switch, through the selected main switch, through a number of sub-delay segments of the first programmable reflective load line arranged between the selected main switch and the selected sub-delay switch, through the selected sub-delay switch, to ground, and then returns along the reverse path.

17. The method of claim 16, further comprising:

providing control signals to a second plurality of main switches arranged along a second programmable reflective load line of the integrated circuit to (i) open any main switch of the second plurality of main switches that is nearer to a second input of the second programmable reflective load line than a selected main switch of the second plurality of main switches and (ii) close the selected main switch and any main switch of the second plurality of main switches that is further from the second input than the selected main switch;

providing control signals to a second plurality of sub-delay switches of the second programmable reflective load line of the integrated circuit to (i) open any sub-delay switch of the second plurality of sub-delay switches that is nearer to the selected main switch of the second programmable reflective load line than a selected sub-delay switch of the second plurality of sub-delay switches and (ii) close the selected sub-delay switch and any sub-delay switch of the second plurality of sub-delay switches that is further from the selected main switch than the selected sub-delay switch; and transmitting the signal along the second programmable reflective load line, wherein the signal travels from the second input, through a number of main delay segments of the second programmable reflective load line arranged between the second input and the selected main switch, through the selected main switch, through a number of sub-delay segments of the second programmable reflective load line arranged between the selected main switch and the selected sub-delay switch, through the selected sub-delay switch, to ground, and then returns along the reverse path;

wherein the number of main delay segments of the first programmable reflective load line arranged between the first input and the selected main switch of the first programmable reflective load line is equal to the number of main delay segments of the second programmable reflective load line arranged between the second input and the selected main switch of the second programmable reflective load line; and wherein the number of sub-delay segments of the first programmable reflective load line arranged between the selected main switch and the selected sub-delay switch of the first programmable reflective load line is equal to the number of sub-delay segments of the second programmable reflective load line arranged between the selected main switch and the selected sub-delay switch of the second programmable reflective load line.

18. The method of claim 17, further comprising receiving the signal at an input port of a hybrid coupler of the integrated circuit, wherein a coupled port of the hybrid coupler is electrically connected to the first input to transmit the signal along the first programmable reflective load line, and wherein a through port of the hybrid coupler is electrically connected to the second input to transmit the signal along the second programmable reflective load line.

19. The method of claim 18, further comprising providing control signals to a first tunable capacitance arranged between (i) a node adjoining the first input and the main delay segments of the first programmable reflective load line and (ii) ground, and to a second tunable capacitance arranged between (i) a node adjoining the second input and the main delay segments of the second programmable reflective load line and (ii) ground, to fine tune a time delay applied to the signal received at the input port of the hybrid coupler.

20. The method of claim 18, wherein the integrated circuit is implemented in a semiconductor process stack, and wherein the sub-delay segments of the first programmable reflective load line, the sub-delay segments of the second programmable reflective load line, and the hybrid coupler each comprise vertically stacked coils formed in multiple metal layers of the semiconductor process stack.

* * * * *